United States Patent
Lee et al.

(10) Patent No.: US 12,517,411 B2
(45) Date of Patent: Jan. 6, 2026

(54) LIGHT PATH CONTROL MEMBER AND DISPLAY DEVICE COMPRISING SAME

(71) Applicant: LG INNOTEK CO., LTD., Seoul (KR)

(72) Inventors: In Hae Lee, Seoul (KR); Chan Mi Ju, Seoul (KR); Hyeon Ji Hong, Seoul (KR); Jun Lee, Seoul (KR); Gyu Lin Lee, Seoul (KR); Beom Sun Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 344 days.

(21) Appl. No.: 18/043,812

(22) PCT Filed: Sep. 3, 2021

(86) PCT No.: PCT/KR2021/011902
§ 371 (c)(1),
(2) Date: Mar. 2, 2023

(87) PCT Pub. No.: WO2022/050745
PCT Pub. Date: Mar. 10, 2022

(65) Prior Publication Data
US 2023/0341742 A1 Oct. 26, 2023

(30) Foreign Application Priority Data

Sep. 3, 2020 (KR) .................. 10-2020-0112285
Nov. 20, 2020 (KR) .................. 10-2020-0156718

(51) Int. Cl.
*G02F 1/167* (2019.01)
*G02F 1/13* (2006.01)
(Continued)

(52) U.S. Cl.
CPC ............ *G02F 1/167* (2013.01); *G02F 1/1323* (2013.01); *G02F 1/1681* (2019.01); *G06F 3/041* (2013.01);
(Continued)

(58) Field of Classification Search
CPC  G02B 26/023; G02B 26/08; G02B 2207/123; G02F 1/1323; G02F 1/167;
(Continued)

(56) References Cited

U.S. PATENT DOCUMENTS 12,092,937 B2    9/2024  Kim et al.
2002/0056505 A1  5/2002  Honda et al.
(Continued)

FOREIGN PATENT DOCUMENTS

JP    2003-208107 A    7/2003
JP    2010-85566 A     4/2010
(Continued)

OTHER PUBLICATIONS

International Search Report dated Dec. 15, 2021 in International Application No. PCT/KR2021/011902.
(Continued)

*Primary Examiner* — Jia X Pan
(74) *Attorney, Agent, or Firm* — Saliwanchik, Lloyd & Eisenschenk

(57) ABSTRACT

A light path control member according to an embodiment comprises: a first substrate; a first electrode disposed on the first substrate; a second substrate disposed on the first substrate; a second electrode disposed under the second substrate; and a light conversion part disposed between the first electrode and the second electrode, wherein: the light conversion part comprises a plurality of partition wall portions, a plurality of receiving portions, and a base portion; a light conversion material is disposed in the receiving portions; the light conversion part includes a first sealing portion which seals the light conversion material; the first sealing portion extends in a direction from one end to the
(Continued)

other end thereof; and the other end of the first sealing portion is arranged to extend into the inner area of the receiving portions.

18 Claims, 23 Drawing Sheets

(51) Int. Cl.
  *G02F 1/1681* (2019.01)
  *G06F 3/041* (2006.01)
  *H10K 59/80* (2023.01)
(52) U.S. Cl.
  CPC ......... *H10K 59/80* (2023.02); *H10K 59/8722* (2023.02)
(58) Field of Classification Search
  CPC ..... G02F 1/1679; G02F 1/1681; H10K 59/50; H10K 59/8791; H10K 59/8722
  See application file for complete search history.

(56) References Cited

U.S. PATENT DOCUMENTS

| | | |
|---|---|---|
| 2009/0109520 A1 | 4/2009 | Park et al. |
| 2009/0231676 A1 | 9/2009 | Uchida |
| 2011/0175869 A1 | 7/2011 | Kim et al. |
| 2013/0202840 A1 | 8/2013 | Nakamura et al. |
| 2015/0226885 A1 | 8/2015 | Lee et al. |
| 2017/0010516 A1* | 1/2017 | Shiota ............... G02F 1/133512 |
| 2019/0250482 A1 | 8/2019 | Shiota et al. |
| 2021/0373403 A1 | 12/2021 | Kim et al. |

FOREIGN PATENT DOCUMENTS

| | | | |
|---|---|---|---|
| JP | 2010085566 A | * | 4/2010 |
| JP | 2013-37190 A | | 2/2013 |
| JP | 2013037190 A | * | 2/2013 |
| JP | 2013-161023 A | | 8/2013 |
| JP | 2016-62092 A | | 4/2016 |
| JP | 2018-25682 A | | 2/2018 |
| JP | 2018-25699 A | | 2/2018 |
| JP | 2018-81253 A | | 5/2018 |
| JP | 2018-205479 A | | 12/2018 |
| JP | 2019-60946 A | | 4/2019 |
| JP | 2019-90958 A | | 6/2019 |
| JP | 2020-16860 A | | 1/2020 |
| KR | 2000-0016996 A | | 3/2000 |
| KR | 10-2007-0062392 A | | 6/2007 |
| KR | 10-2012-0034517 A | | 4/2012 |
| KR | 10-1257685 B1 | | 4/2013 |
| KR | 10-1512857 B1 | | 4/2015 |
| KR | 10-2015-0094871 A | | 8/2015 |
| KR | 10-2018-0004879 A | | 1/2018 |
| KR | 10-2020-0028078 A | | 3/2020 |
| WO | 2015/122083 A1 | | 8/2015 |

OTHER PUBLICATIONS

Office Action dated Jan. 23, 2024 in Japanese Application No. 2023-513204.
Office Action dated Jul. 22, 2024 in Korean Application No. 10-2020-0112285.
Supplementary European Search Report dated Sep. 3, 2024 in European Application No. 21864704.8.
Office Action dated Jul. 19, 2025 in Chinese Application No. 202180054639.6.

* cited by examiner

Fig. 26
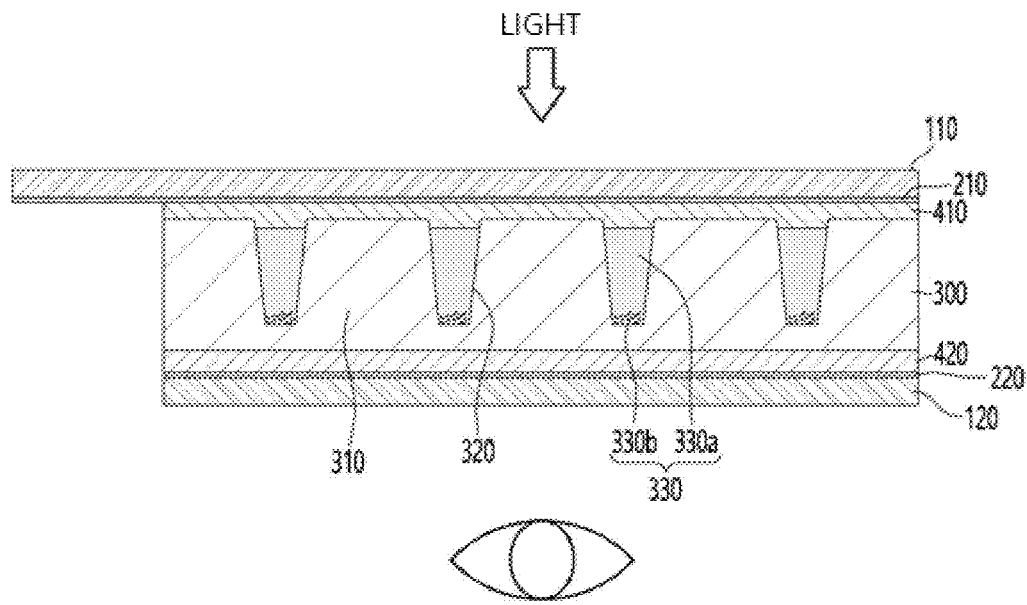
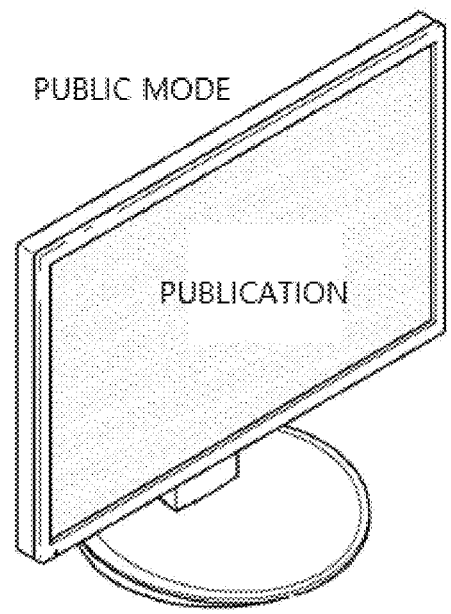

Fig. 27
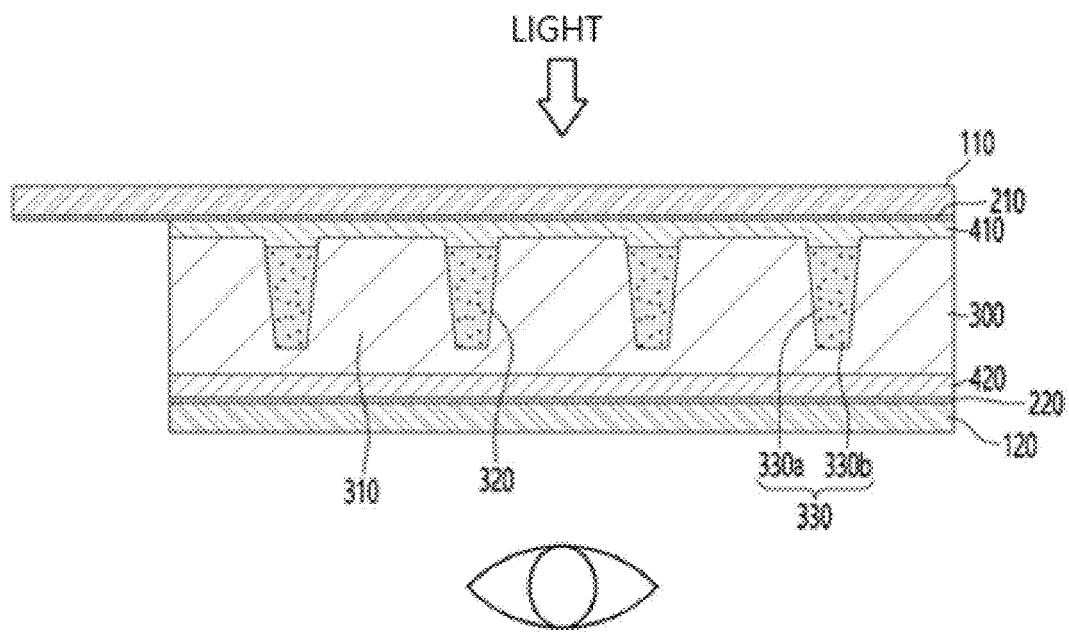
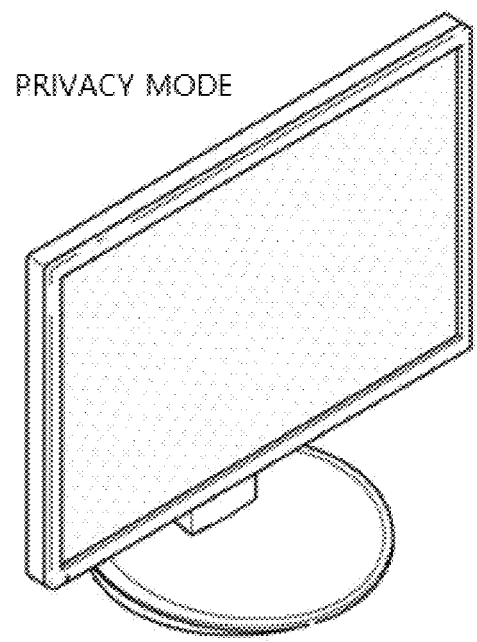

LIGHT PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/011902, filed Sep. 3, 2021, which claims the benefit under 35 U.S.C. § 119 of Korean Application Nos. 10-2020-0112285, filed Sep. 3, 2020; and 10-2020-0156718, filed Nov. 20, 2020; the disclosures of each of which are incorporated herein by reference in their entirety.

TECHNICAL FIELD

An embodiment relates to a light path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an light path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a receiving portion into a light transmitting part and a light blocking part by filling the inside of the accommodating portion with light conversion material including particles that may move when a voltage is applied and a dispersion liquid for dispersing the particles and by dispersing and aggregating the particles.

The light conversion material may be injected from the injection part toward the exit part by a capillary method in which one end of the receiving portion serves as an injection part and the other end serves as an exit part. Subsequently, the light conversion material may be sealed inside the receiving portion by sealing the injection part and the outlet part with a sealing portion.

Accordingly, reliability and driving characteristics of the light path control member may be reduced due to leakage of the light conversion material when the sealing portion is removed.

Accordingly, the light path control member having a new structure capable of solving the above problems is required.

DISCLOSURE

Technical Problem

An embodiment relates to a light path control member having improved reliability and driving characteristics.

Technical Solution

A light path control member according to an embodiment includes: a first substrate; a first electrode disposed on the first substrate; a second substrate disposed on the first substrate; a second electrode disposed under the second substrate; and a light conversion part disposed between the first electrode and the second electrode, the light conversion part includes a plurality of partition wall portions, a plurality of receiving portions, and a base portion, a light conversion material is disposed in the receiving portion, the light path control member comprises a first sealing portion sealing the light conversion material, the first sealing portion extends from one end to the other end, the other end of the first sealing portion extends into the inner region of the receiving portion.

Advantageous Effects

The light path control member according to the embodiment may improve the adhesive property of the sealing portion.

In detail, since the sealing portion for sealing the light conversion material inside the receiving portion is bent toward the inside of the receiving portion, a contact area of the sealing portion may be increased.

Accordingly, since the adhesive area of the sealing portion is increased, the adhesive properties of the sealing portion may be improved.

In addition, since the sealing portion is bent toward the inside of the receiving portion to increase the area of the sealing portion, leakage of the light conversion material or penetration of external impurities into the receiving portion may be effectively inhibited.

Accordingly, the light path control member according to the embodiment may have improved reliability and driving characteristics.

DESCRIPTION OF DRAWINGS

FIGS. 26 to 28 are views for explaining one embodiment of the display device to which the light path control member according to the embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a light path control member according to an embodiment will be described with reference to drawings.

Figure 1:
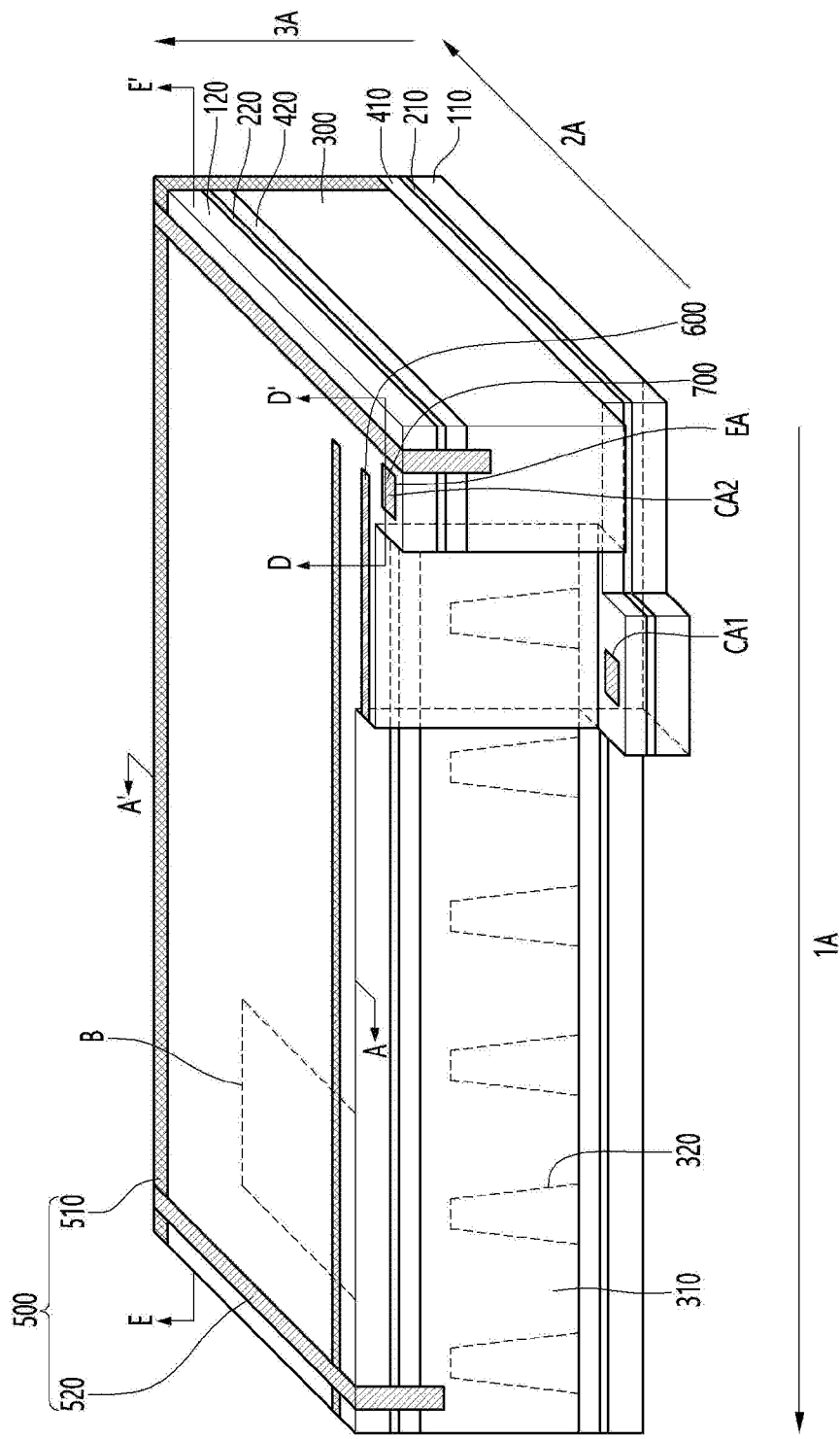
FIG. 1 is a perspective view of a light path control member according to an embodiment.

FIG. 1 is a perspective view of a light path control member according to an embodiment.

Referring to FIG. 1, the light path control member 1000 according to the embodiment may include a first substrate 110, a second substrate 120, a first electrode 210, a second electrode 220, a light conversion part 300, a first sealing portion 510, and a second sealing portion 520

The light conversion part 300 may be disposed between the first substrate 110 and the second substrate 120. In detail, the light conversion part 300 may be disposed between the first electrode 210 and the second electrode 220.

An adhesive layer 410 may be disposed between the light conversion part 300 and the first electrode 210. For example, a transparent adhesive layer capable of transmitting light may be disposed between the light conversion part 300 and the first electrode 210. For example, the adhesive layer 410 may include an optically clear adhesive (OCA).

In addition, a buffer layer 420 may be disposed between the light conversion part 300 and the second electrode 220. Accordingly, adhesion between the light conversion part 300 and the second electrode 220, which are different materials, may be improved.

The light conversion part 300 and the second electrode 220 may be bonded by the buffer layer 420.

Figure 2:
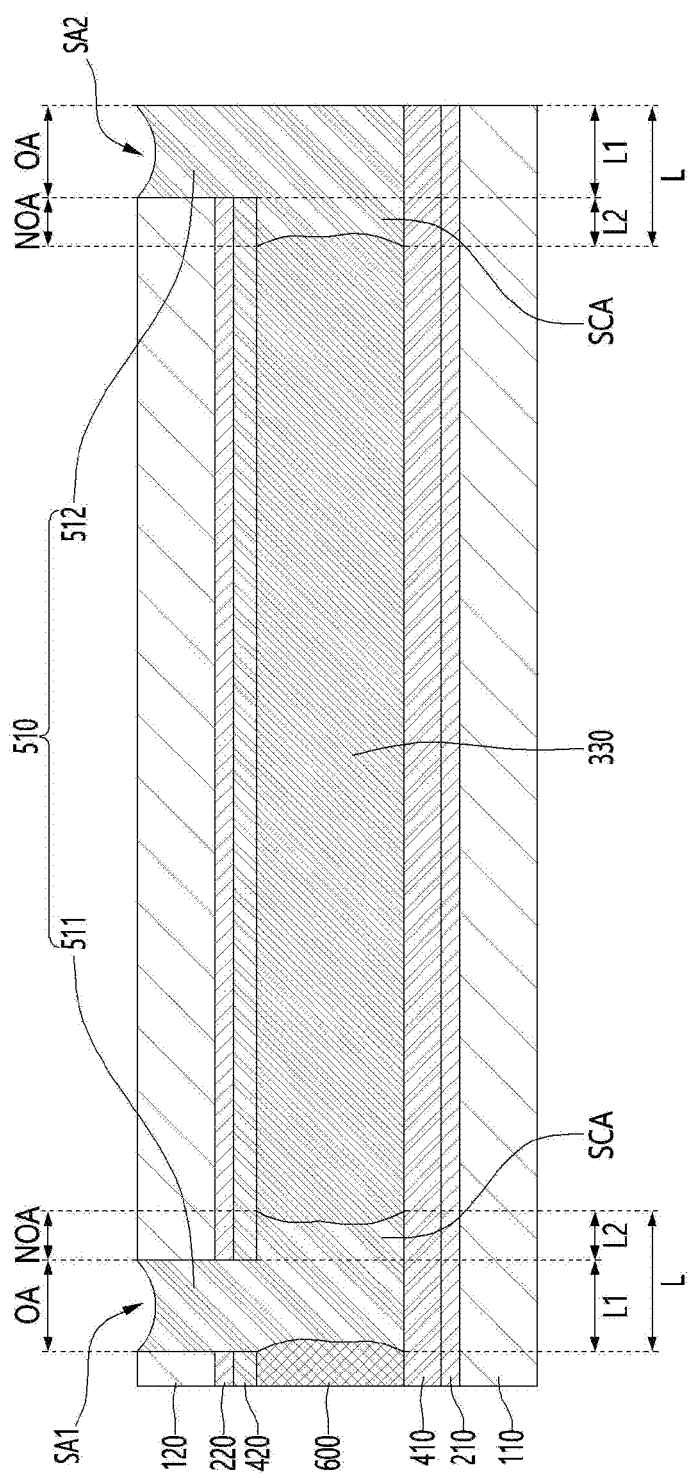
FIG. 2 is cross-sectional views taken along area A-A' of FIG. 1.

FIG. 2 is cross-sectional view taken along area A-A' of FIG. 1.

Referring to FIGS. 1 and 2, the light conversion part 300 may include a plurality of partition wall portions 310, a plurality of receiving portions 320, and a base portion 350.

Each of the partition wall portion 310 and the accommodating portion 320 may include a plurality of numbers, and the partition wall portion 310 and the receiving portion 320 may be alternately disposed. That is, one receiving portion 320 may be disposed between two adjacent partition wall portions, and one partition wall portion 310 may be disposed between the two adjacent receiving portions.

Although five receiving portions are shown in FIG. 1, this is shown for convenience of explanation, and the receiving portions may be formed in dozens or more.

The base portion 350 may be disposed on the receiving portion 320. In detail, the base portion 350 may be disposed between the receiving portion 320 and the buffer layer 420. Accordingly, the light conversion part 300 may be adhered to the second electrode 220 by the base portion 350 and the buffer layer 420.

The base portion 350 is a region formed during an imprinting process for forming the partition wall portion 310 and the receiving portion 320, and may include the same material as the partition wall portion 310.

The partition wall portion 310 may transmit light. In addition, light transmittance of the receiving portion 320 may be changed by applying a voltage.

In detail, the receiving portion 320 may be disposed extending in one direction. A light conversion material 330 may be disposed inside the receiving portion 320. The light transmittance of the receiving portion 320 may be changed by the light conversion material 330. The light conversion material 330 may include light conversion particles 330b moved by application of a voltage and a dispersion liquid 330a dispersing the light conversion particles 330b. In addition, the light conversion material 330 may further include a dispersing agent that inhibits aggregation of the light conversion particles 330b.

The light conversion material 330 is disposed inside the receiving portion 320, and first sealing portions 510 are disposed at one end and the other end of the receiving portion 320, respectively, and thereby the light conversion material 330 may be disposed inside the receiving portion 320.

Meanwhile, the first sealing portion 510 may include a bending area. In detail, while extending from one end to the other end, the first sealing portion 510 may be disposed extending toward the inside of the receiving portion 320 by the bending area. That is, the first sealing portion 510 may directly contact the receiving portion 320. That is, the first sealing portion 510 may directly contact the side surface of the partition wall portion 310 and also directly contact the receiving portion 320.

Accordingly, a contact area of the first sealing portion 510 may be increased. That is, since the first sealing portion 510 extends from one end to the other end and the other end extends to the inner region of the receiving portion 320, the first sealing portion 510 may also contact the inner surface of the receiving portion 320.

Accordingly, since the contact area of the first sealing portion 510 is increased, the adhesive property of the first sealing portion 510 may be improved. In addition, since an area of the first sealing portion 510 disposed inside the receiving portion 320 increases, leakage of the light conversion material 330 may be effectively inhibited.

Meanwhile, the light conversion material 330 and the first sealing portion 510 may be disposed inside the receiving portion 320 by a capillary method.

FIGS. 3 to 10 are views for explaining a process of injecting and sealing the light conversion material 330 into the receiving portion 320.

Figure 3:
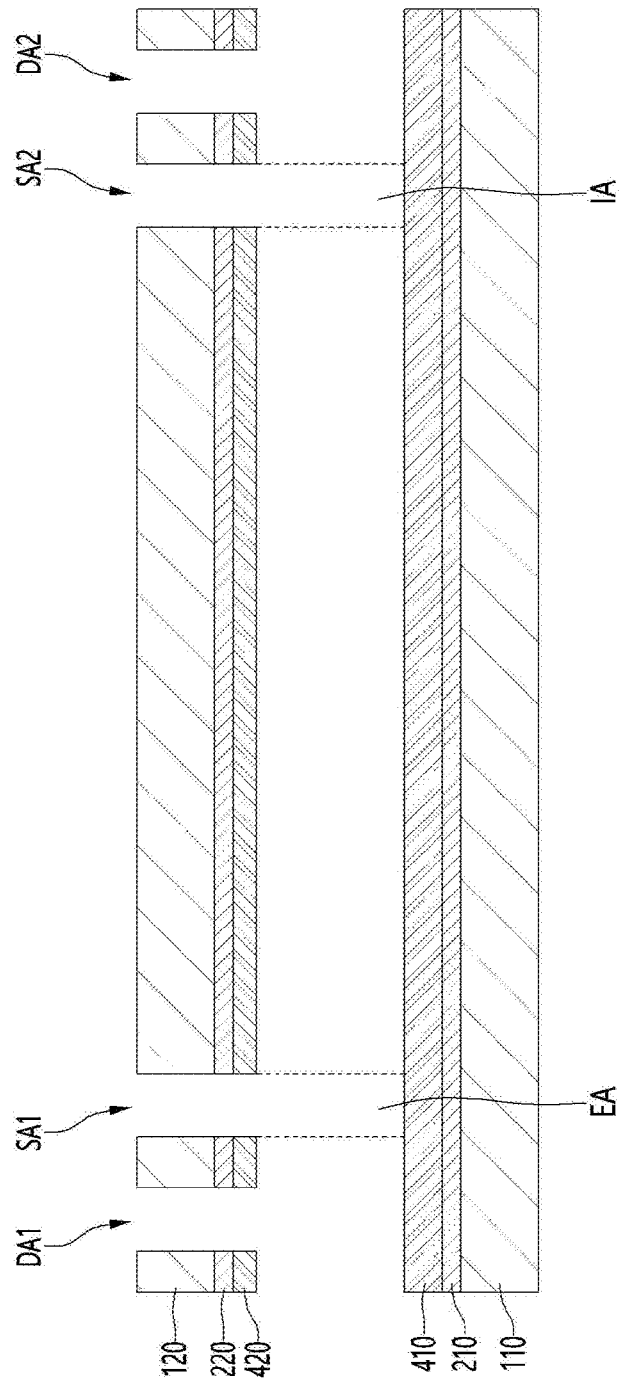
FIGS. 3 to 10 are views for explaining a process of disposing a light conversion material and a sealing portion in a light path control member according to the embodiment.
Figure 4:
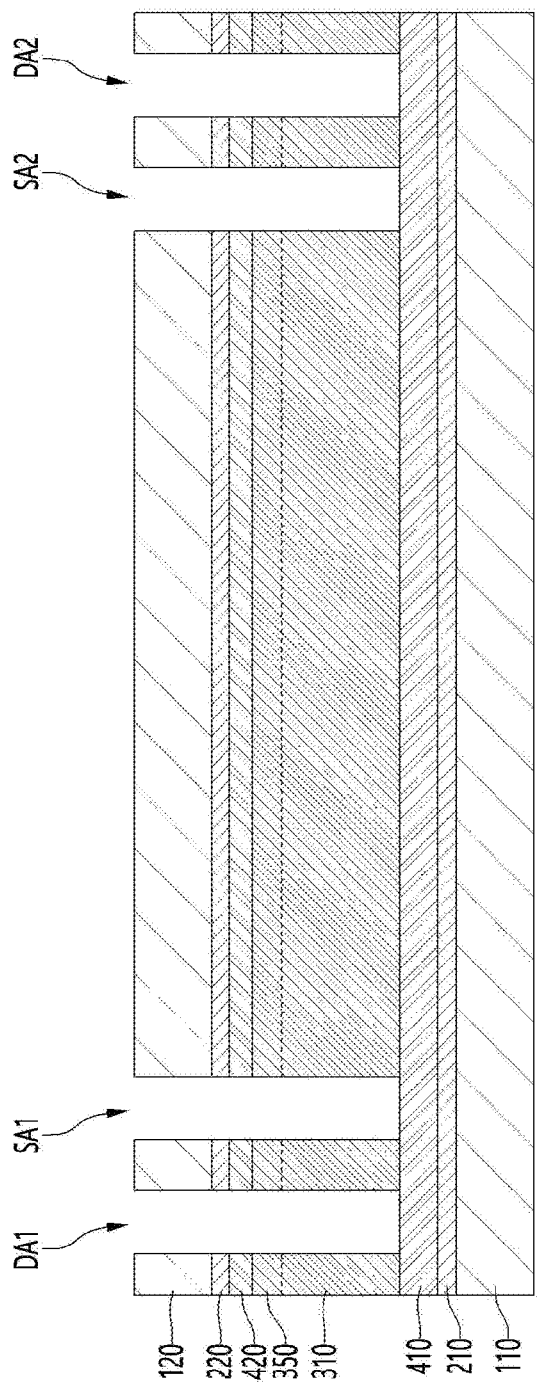

First, referring to FIGS. 3 and 4, a plurality of regions may be formed in the second substrate 120, the second electrode 220, the buffer layer 420, and the light conversion part 300.

FIG. 3 is a cross-sectional view of the receiving portion 320 taken in a longitudinal direction, and FIG. 4 is a cross-sectional view of the partition wall portion 310 taken in a longitudinal direction.

In detail, a sealing region SA and a dam region DA passing through the second substrate 120, the second electrode 220, the buffer layer 420, and the light conversion part 300 may be formed.

Also, the embodiment is not limited thereto, and only the sealing region SA may be formed without the dam region DA.

The sealing region SA may be a region into which a light conversion material and a sealing material are injected, and the dam region DA may be a region into which a dam material is injected.

The sealing region SA may include a first sealing region SA1 and a second sealing region SA2 facing each other. In detail, the sealing region SA may include the first sealing region SA1 and the second sealing region SA2 facing each other in the length direction of the receiving portion 320.

The first sealing region SA1 and the second sealing region SA2 may be formed by penetrating the second substrate 120, the second electrode 220, the buffer layer 420, and the base portion 350, and entirely or partially removing the partition wall portion 310 of the light conversion part 300.

Accordingly, the end of the first sealing region SA1 and the end of the second sealing region SA2 may meet both ends of the receiving portion 320, respectively.

Accordingly, the light conversion material may be injected into the receiving portion 320 by the first sealing region SA1 and the second sealing region SA2, and the light conversion material inside the receiving portion 320 may be sealed by the subsequently injected sealing material.

Although FIG. 4 shows that both the base portion 350 and the partition wall portion 310 are formed through penetration, the embodiment is not limited thereto, and the first sealing region SA1 and the second sealing region SA2 may be formed by partially removing the partition wall portion 310.

A passage for injecting the light conversion material 330 may be formed in the receiving portion 320 by the first sealing region SA1 and the second sealing region SA2.

In detail, an injection part IA into which the light conversion material 330 is injected may be formed in the receiving portion 320 by the second sealing region SA2, and an exit part EA through which the light conversion material 330 is discharge may be formed in the receiving portion 320 by the first sealing region SA1. Accordingly, the injection part IA may be formed at one end of the receiving portion 320, and the exit part EA may be formed at the other end of the receiving portion 320.

The dam region DA may be disposed outside the sealing region SA and spaced apart from the sealing region SA.

The dam region DA may include a first dam region DA1 and a second dam region DA2 facing each other. In detail, the dam region DA may include the first dam region DA1 and the second dam region DA2 facing each other in the longitudinal direction of the receiving portion 320.

The first dam region DA1 may be disposed outside the first sealing region SA1, and the second dam region DA2 may be disposed outside the second sealing region SA2.

The first dam region DA1 and the second dam region DA2 may be formed by penetrating the second substrate 120, the second electrode 220, the buffer layer 420, and the base portion 350, and entirely or partially removing the partition wall portion 310 of the light conversion part 300.

Although FIG. 4 shows that both the base portion 350 and the partition wall portion 310 are formed through penetration, the embodiment is not limited thereto, and the first dam region DA1 and the second dam region DA1 may be formed by partially removing the partition wall portion 310.

Also, as described above, the dam region DA may be omitted. That is, only the sealing region SA may be formed.

For convenience of explanation, the following embodiments are described based on the case where there is a dam region DA, but the embodiments are not limited thereto.

Figure 5:
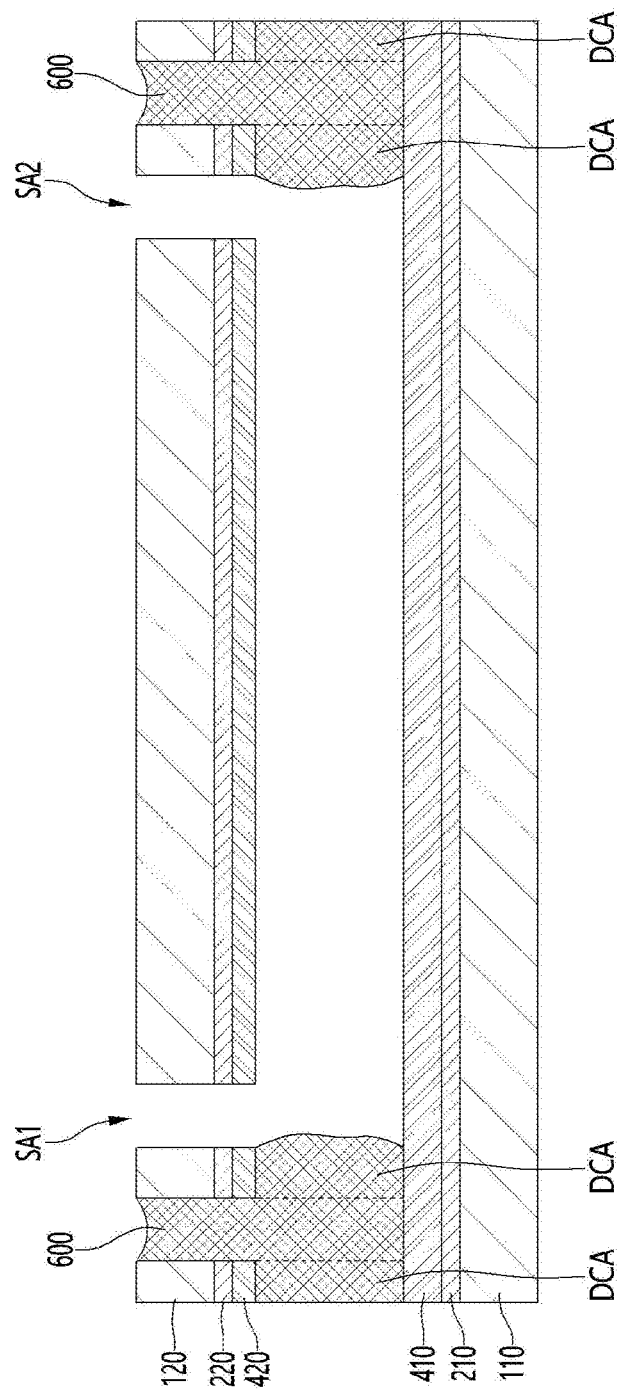

Subsequently, referring to FIG. 5, a dam portion 600 may be disposed in the dam region DA. In detail, dam portions 600 may be disposed in the first dam region DA1 and the second dam region DA2.

The dam portion 600 may be disposed while filling the inside of the dam region DA. The dam portion 600 may serve to inhibit the light conversion material 330 from overflowing to the outside when the light conversion material 330 is injected through the injection part IA and the exit part EA.

The dam portion 600 may include a bending area. In detail, the dam portion 600 may be disposed inside the dam region DA and inside the receiving portion 320. That is, the dam portion 600 may be bent in the dam region DA and extended toward the inside of the receiving portion 320.

In detail, the dam portion 600 may be disposed to extend in one longitudinal direction of the receiving portion 320 and in the other longitudinal direction of the receiving portion 320 while filling the dam region DA. In detail, the dam portion 600 may be disposed to extend to a point where the sealing region SA starts.

The dam portion 600 may include a resin material. For example, the dam portion 600 may include polyurethane acrylate. That is, the dam portion 600 may be formed by disposing the resin material inside the dam region DA and the receiving portion 320 and then curing the resin material.

Figure 6:
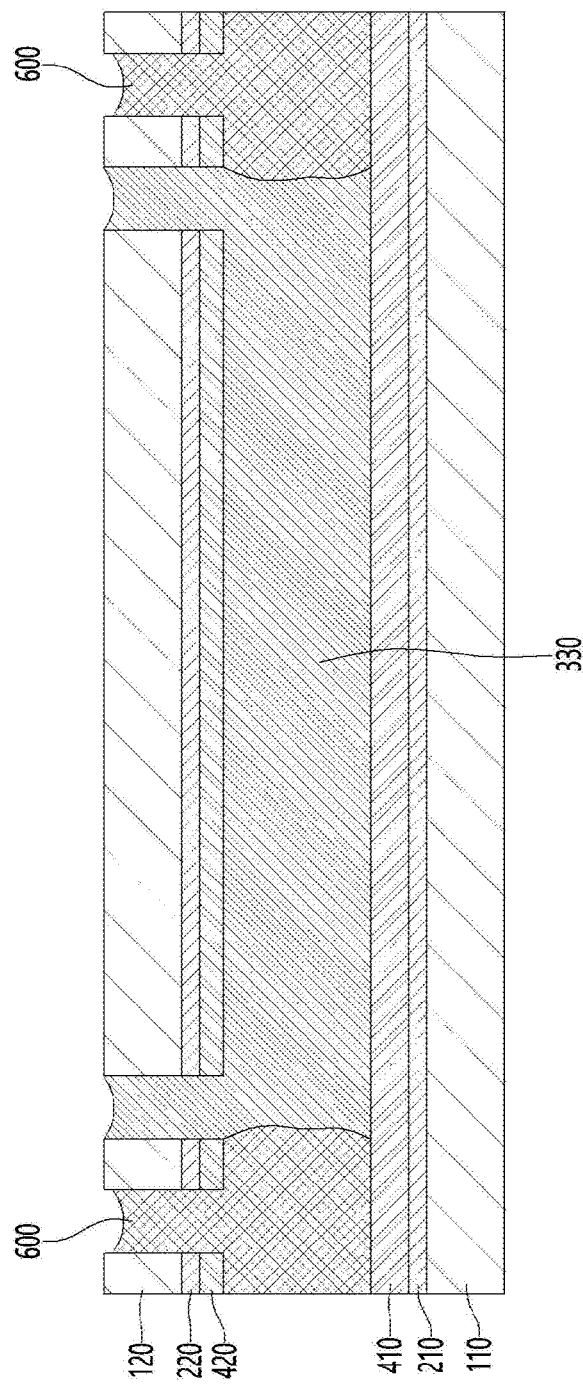

Subsequently, referring to FIG. 6, the light conversion material 330 may be disposed inside the receiving portion 320 by the injection part IA and the exit part EA. In detail, the light conversion material 330 may be applied to the injection part IA, and the light conversion material 330 may move toward the exit part EA by a capillary process and be disposed inside the receiving portion 320.

Accordingly, the light conversion material 330 may fill the inside of the receiving portion 320 between the dam portions 600 and the sealing regions.

Figure 7:
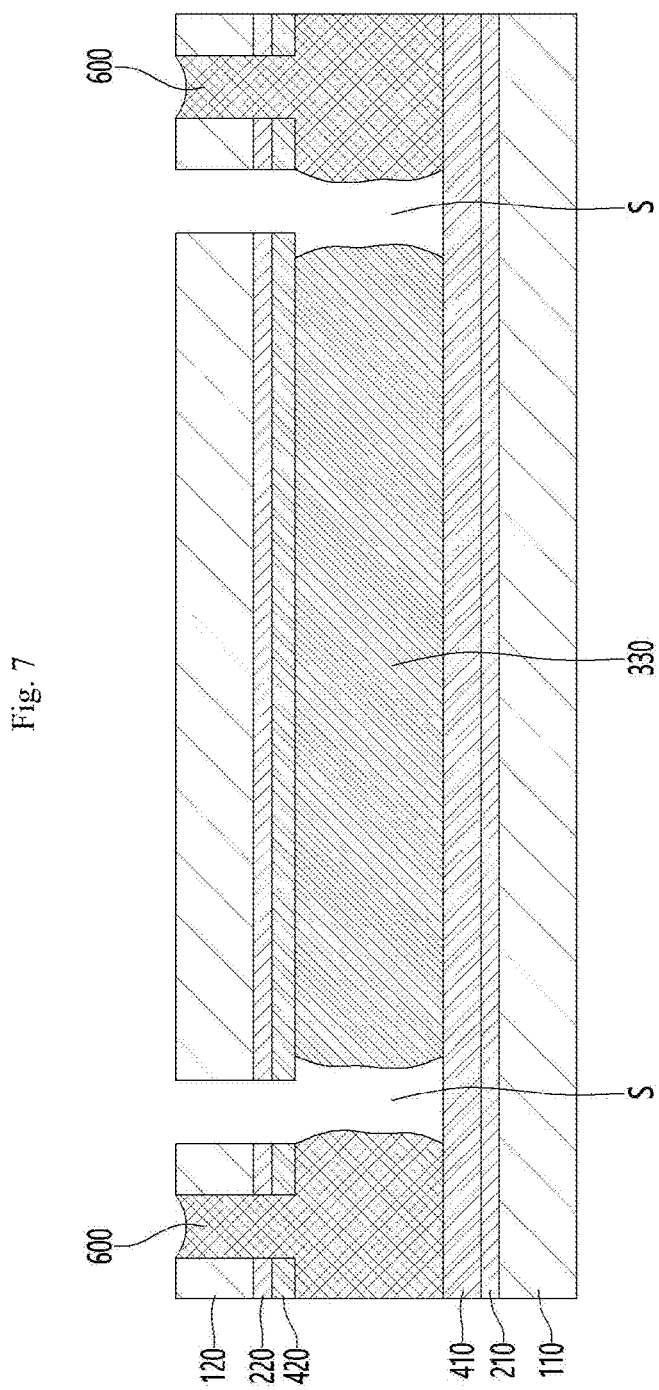

Subsequently, referring to FIG. 7, a portion of the light conversion material 330 inside the sealing region SA and a portion of the light conversion material 330 inside the receiving portion 320 may be removed. In detail, after blocking the second sealing region SA2 on the exit part EA side so that the light conversion material 330 inside the receiving portion 320 is not moved, the first sealing region SA1 on the injection part IA side is cleaned, and after blocking the first sealing region SA1 on the injection part IA side, the second sealing region SA2 on the exit part EA side is cleaned, and thereby the light conversion material 330 disposed inside the sealing region SA may be removed.

Accordingly, a space S in which the sealing material is disposed may be formed by removing the light conversion material disposed inside the sealing region SA and the light conversion material disposed in a partial region of the receiving portion 320.

Alternatively, after blocking the second sealing region SA2 on the exit part EA side so that the light conversion material 330 inside the receiving portion 320 is not moved, the first sealing region SA1 on the injection part IA side is cleaned, and after blocking the first sealing region SA1 on the injection part IA side by disposing a sealing material in the first sealing region SA1 on the injection part IA side, the second sealing region SA2 on the exit part EA side is cleaned, and thereby the light conversion material 330 disposed inside the sealing region SA may be removed.

Figure 8:
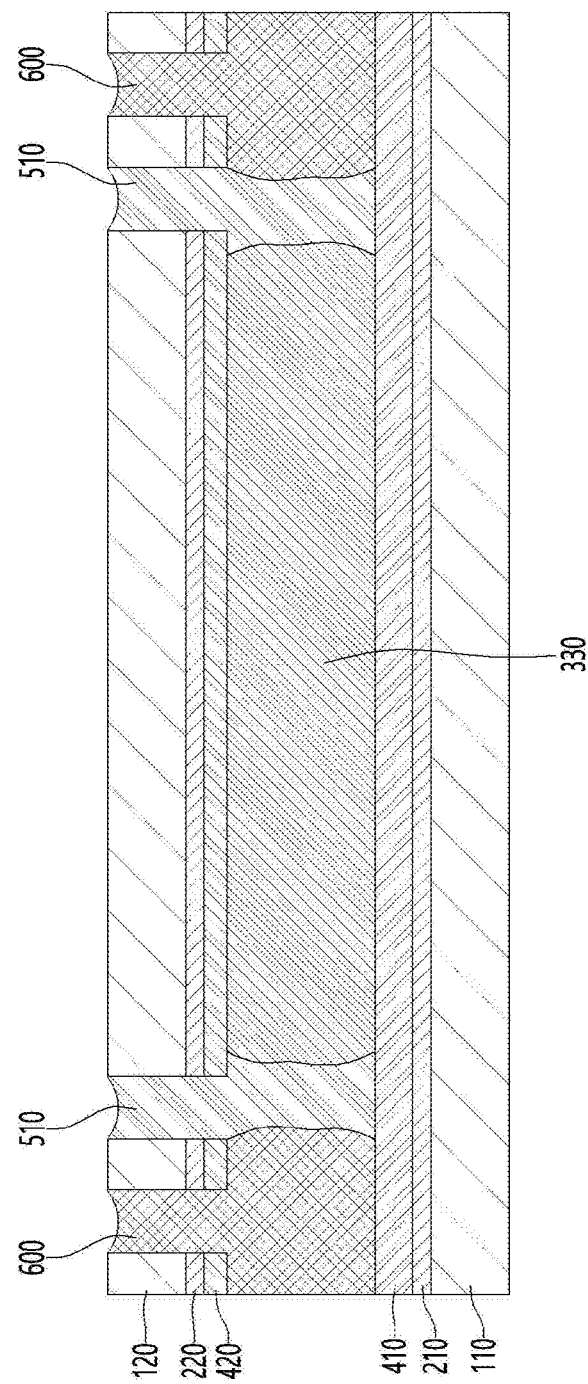

Subsequently, referring to FIG. 8, the sealing material may be filled in the sealing region SA. The sealing material may also be disposed inside the receiving portion 320. That is, the sealing material may extend into the receiving portion 320 in the longitudinal direction of the receiving portion 320 while filling the sealing region SA.

In detail, after the sealing material is applied to the first sealing region SA1 on the side of the injection part IA, the sealing material may extend into the receiving portion 320 through the second sealing region SA2 on the side of the exit part EA by a capillary process. Similarly, after the sealing material is applied to the second sealing region SA2 on the side of the exit part EA, the sealing material may extend into the receiving portion 320 through the first sealing region SA1 on the side of the injection part IA by the capillary process That is, the sealing material may be disposed to extend in the longitudinal direction of the receiving portion 320 to contact the light conversion material disposed inside the receiving portion 320.

Subsequently, by curing the sealing material, a first sealing portion 510 may be disposed on the light conversion part 300. The first sealing portion 510 is disposed while extending from the sealing region SA to the receiving part 320. That is, the first sealing portion 510 extending from one end to the other end may be disposed to extend from the sealing region SA toward the inside of the receiving portion 320, and thereby the first sealing portion 510 may include a bending area SCA. For example, the first sealing portion 510 may be disposed in an "L" shape. That is, based on one receiving portion 320, the first sealing portion 510 may be disposed in an "L" shape by a bending area SCA.

At this time, the curing of the sealing material of the first sealing region SA1 and the second sealing region SA2 may proceed simultaneously or sequentially.

For example, when a sealing material is disposed on the first sealing region SA1 and the second sealing region SA2 after cleaning the first sealing region SA1 and the second sealing region SA2, the sealing material of the first sealing region SA1 and the second sealing region SA2 may be cured simultaneously or sequentially.

Alternatively, if a sealing material is disposed on the first sealing region SA1 after cleaning the first sealing region SA1, and then a sealing material is disposed on the second sealing region SA2 after cleaning the second sealing region SA2, the sealing material of the first sealing region SA1 may be cured first, and the sealing material of the second sealing region SA2 may be cured.

Subsequently, referring to FIGS. 9 and 10, an unnecessary bezel area may be removed by cutting the dam portion 600 and the sealing portion 500 through a cutting process.

Figure 9:
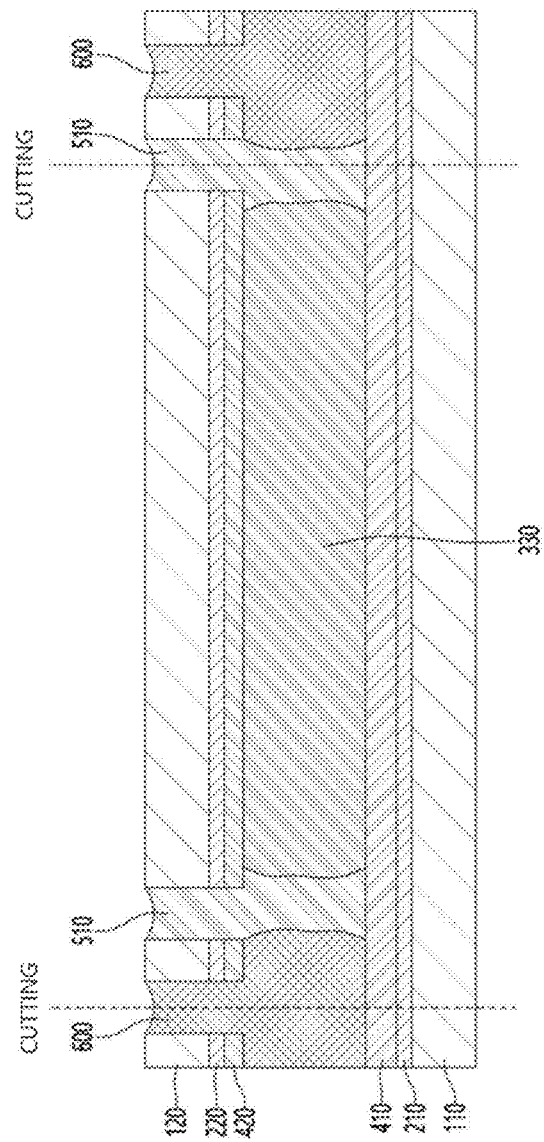
Figure 10:
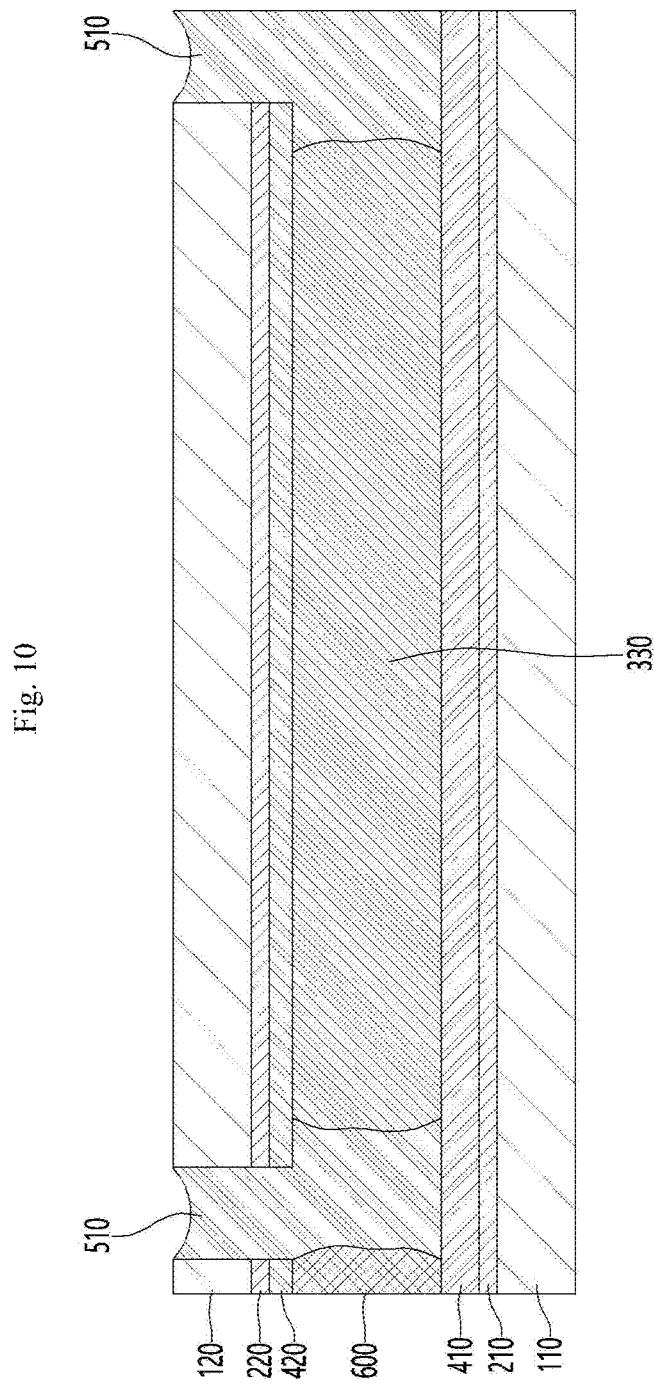

FIGS. 9 and 10 show that the dam region is cut at the exit part side and the first sealing portion 510 is cut at the injection part side, but the embodiment is not limited thereto, and the cut area may be defined in various positions.

The light path control member having the shape shown in FIGS. 1 and 2 may be formed through the process.

Referring to FIG. 2, the first sealing portion 510 may include a 1-1 sealing portion 511 and a 1-2 sealing portion 512.

The 1-1 sealing portion 511 and the 1-2 sealing portion 512 may contact the light conversion material and face each other. The 1-1 sealing portion 511 may be defined as a sealing portion disposed in the exit part area of the receiving portion 320, and the 1-2 sealing portion 512 may be defined as a sealing portion disposed in the injection part area of the receiving portion 320.

The 1-1 sealing portion 511 extending from one end to the other end may be disposed to extend from the first sealing portion 511 toward the inside of the receiving portion 320. Accordingly, the other end of the 1-1 sealing portion 511 may be disposed inside the receiving portion 320.

That is, the 1-1 sealing portion 511 may include a bending area SCA between one end and the other end of the 1-1 sealing portion 511.

That is, the 1-1 sealing portion 511 may include a bending area SCA extending from the first sealing region SA1 in a longitudinal direction of the receiving portion 320 and being bent.

Accordingly, the 1-1 sealing portion 511 may be disposed in contact with an inner surface of the first sealing region S1, an upper surface or a lower surface of the buffer layer 420, an inner surface of the receiving portion 320, and a side surface of the partition wall portion 310.

In addition, the 1-2 sealing portion 512 extending from one end to the other end may be disposed to extend from the second sealing region SA2 toward the inside of the receiving portion 320. Accordingly, the other end of the 1-2 sealing portion 512 may be disposed inside the receiving portion 320.

That is, the 1-2 sealing portion 512 may include a bending area SCA between one end and the other end of the 1-2 sealing portion 512.

That is, the 1-2 sealing portion 512 may include a bending area SCA extending from the second sealing region SA2 in the longitudinal direction of the receiving portion 320 and being bent. Accordingly, the 1-2 sealing portion 512 may be disposed in contact with an inner surface of the second sealing region SA2, an upper surface or a lower surface of the buffer layer 420, an inner surface of the receiving portion 320, and a side surface of the partition wall portion 310.

Accordingly, the 1-1 sealing portion 511 and the 1-2 sealing portion 512 may include a sealing portion disposed in the sealing region, a sealing portion disposed in the bending area, and a sealing portion disposed inside the receiving portion. In addition, the sealing portion disposed in the sealing region, the sealing portion disposed in the bending area, and the sealing portion disposed inside the receiving portion may be integrally formed.

The 1-1 sealing portion 511 and the 1-2 sealing portion 512 may extend to the inside of the receiving portion 320 by the bending area. In this case, the 1-1 sealing portion 511 and the 1-2 sealing portion 512 inside the receiving portion 320 may be defined as an overlapping area and a non-overlapping area with the sealing region SA.

Accordingly, lengths L of the 1-1 sealing portion 511 and the 1-2 sealing portion 512 in the direction of the receiving portion 320 may have a first length L1 corresponding to the overlapping area OA and a second length L2 corresponding to the non-overlapping area NOA.

That is, the 1-1 sealing portion 511 and the 1-2 sealing portion 512 may include a first length L1 disposed in the sealing region and a second length L2 disposed inside the receiving portion. Accordingly, the total length of the 1-1 sealing portion 511 and the total length of the 1-2 sealing portion 512 may be defined as the sum of the first length L1 and the second length L2.

The first length L1 may be 3 mm or less. In detail, the first length L1 may be 100 μm to 2 mm. In more detail, the first length L1 may be 300 μm to 700 μm. In more detail, the first length L1 may be 400 μm to 600 μm.

When the first length L1 exceeds 3 mm, an unnecessary bezel area may be increased by increasing the width of the sealing region SA. In addition, when the first length L1 is less than 200 μm, it becomes difficult to inject the sealing material into the sealing region SA, and the sealing material may overflow to the outside during the injection process.

The second length L2 may be 2 mm or less. In detail, the second length L2 may be 100 μm to 2 mm. In more detail, the second length L2 may be 200 μm to 1 mm. In more detail, the second length L2 may be 300 μm to 700 μm. In more detail, the second length L2 may be 400 μm to 550 μm.

When the second length L2 is less than 100 μm, the sealing effect of the light conversion material 330 may be reduced, and an adhesion property of the sealing portion by reducing the contact area of the 1-1 sealing portion 511 or the 1-2 sealing portion 512. In addition, adhesive properties may be reduced due to lifting of the sealing portion in the bent area, and the light conversion material may flow out through a gap formed by delaminated of the partition wall portion and the sealing portion.

In addition, when the second length L2 exceeds 2 mm, an area where the sealing portion is disposed becomes too large, so an unnecessary bezel area may increase.

Figure 11:
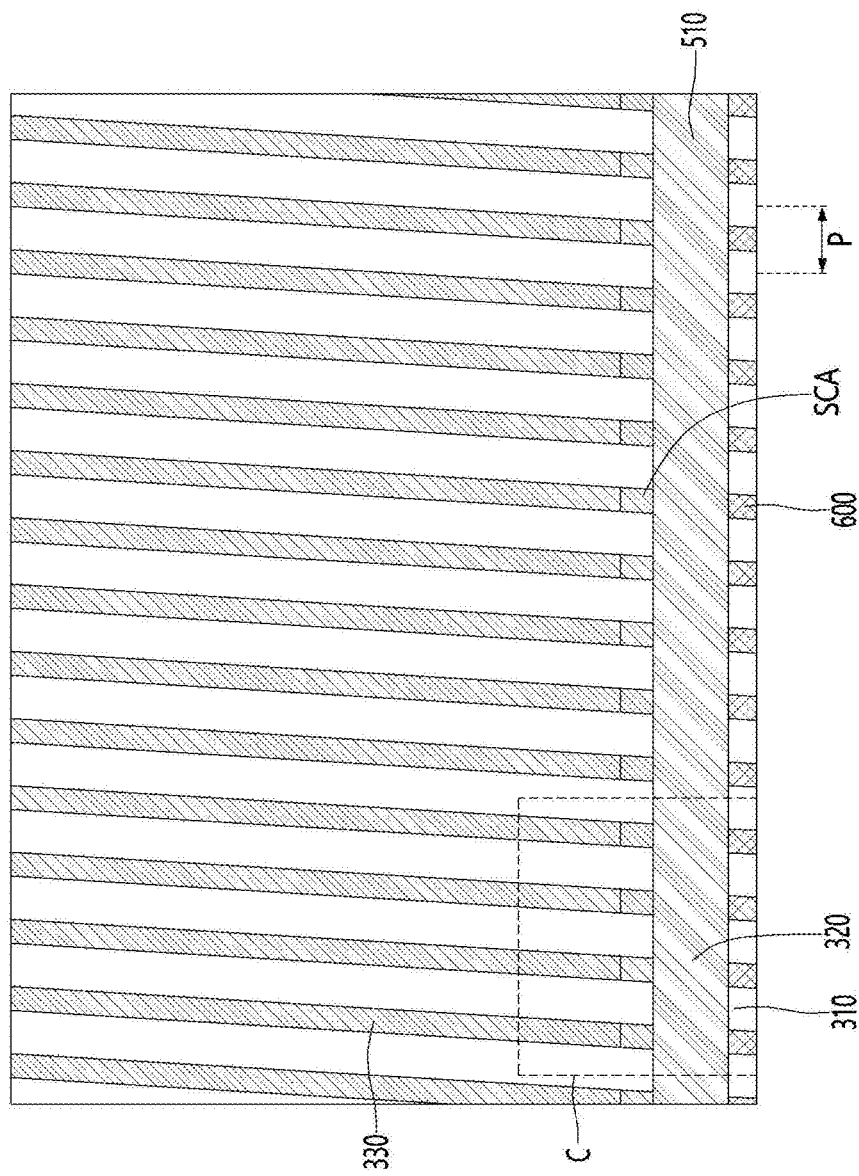
FIG. 11 is an enlarged plan view of area B of FIG. 1.
Figure 12:
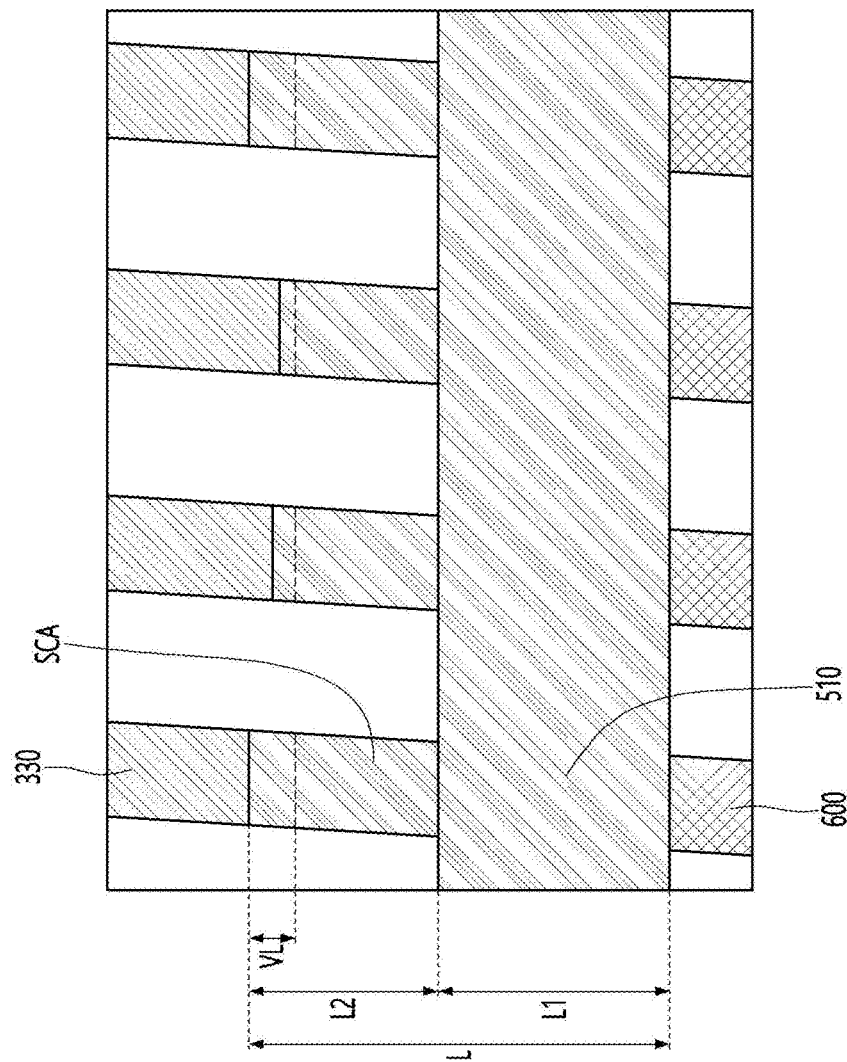
FIG. 12 is an enlarged view of region C of FIG. 11.

FIGS. 11 and 12 are views for explaining a length deviation of a 1-1 sealing portion 511 and a 1-2 sealing portion 512 disposed in a plurality of receiving portions in the direction of the receiving portion.

Referring to FIGS. 11 and 12, the receiving portion 320 may include a plurality of receiving portions. The first sealing portion 510 and a light conversion material 330 may be disposed in the receiving portion 320. That is, the first sealing portions 510 described above may be disposed at both ends of each receiving portion 320, and the light conversion material 330 may be disposed between the first sealing portions 510.

The first sealing portions 510 may have a first length L1 and a second length L2 toward the receiving portion. That is, as described above, the total length L of the first sealing portion 510 may be defined as the sum of the first length L1 and the second length L2.

The length L of the first sealing portion 510 corresponding to each receiving portion may be similar or different. In detail, the length L of the first sealing portion 510 may be different by the deviation length VL.

That is, the second length L2 may be differently disposed in each receiving portion, and thus, the first sealing portion 510 may have a different length in each receiving portion due to the deviation length VL.

In detail, the maximum deviation length VL of the first sealing portion may be 100 μm or less. In more detail, the maximum deviation length VL of the first sealing portion may be 1 μm to 100 μm. In more detail, the maximum deviation length VL of the first sealing portion may be 20 μm to 80 μm. In more detail, the maximum deviation length VL of the first sealing portion may be 30 μm to 70 μm. In more detail, the maximum deviation length VL of the first sealing portion may be 40 μm to 60 μm.

Also, the maximum deviation length VL of the first sealing portion may be 50% or less of the first length L1 of the sealing portion. In detail, the maximum deviation length VL of the first sealing portion may be 1% to 50% or less of the first length L1 of the sealing portion. In detail, the maximum deviation length VL of the first sealing portion may be 2% to 40% or less of the first length L1 of the sealing portion. In detail, the maximum deviation length VL of the first sealing portion may be 3% to 30% or less of the first length L1 of the sealing portion. In detail, the maximum deviation length VL of the first sealing portion may be 4% to 20% or less of the first length L1 of the sealing portion.

When the deviation length VL of the first sealing portion exceeds 100 μm or exceeds 50% of the first length L1 of the sealing portion, a content deviation of the light conversion material disposed inside the receiving portion may occur, and thereby the luminance uniformity of the light path control member may be reduced due to the content variation.

The length deviation of the first sealing portions 510 may be caused by a different capillary effect of the sealing material in the plurality of receiving portions when the sealing portion is disposed inside each receiving portion. That is, a variation in the cross-sectional area of the receiving portion may occur in each receiving portion due to a variation in the pitch P of the partition wall portions 310, and a variation in the capillary effect of the sealing material may occur due to the variation in the cross-sectional area.

In order to satisfy the first sealing portion deviation as described above, the pitch deviation of the partition wall portion 310 may be 40 μm or less. In detail, the pitch deviation of the partition wall portion 310 may be 0.001 μm to 40 μm. In detail, the pitch deviation of the partition wall portion 310 may be 0.001 μm to 30 μm. In detail, the pitch deviation of the partition wall portion 310 may be 0.001 μm to 20 μm. In detail, the pitch deviation of the partition wall portion 310 may be 0.001 μm to 10 μm.

The first length L1, the second length L2, and the deviation length VL may be different from each other.

The first length L1 may be greater than the second length L2 and the deviation length L2. Also, the second length L2 may be greater than the deviation length VL.

For example, the second length L2 may be 90% or more of the first length L1. Alternatively, the second length L2 may be 80% or more of the first length L1. Alternatively, the second length L2 may be 70% or more of the first length L1. Alternatively, the second length L2 may be 60% or more of the first length L1. Alternatively, the second length L2 may be 50% or more of the first length L1.

Since the first length L1 is greater than the second length L2, an increase in the bezel area due to the sealing portion disposed inside the receiving portion 320 may be minimized.

Meanwhile, the sealing material forming the first sealing portion 510 may include a material having low viscosity.

Accordingly, the sealing material may be effectively moved to the inner region of the receiving portion by the capillary process.

In detail, the sealing material may have a viscosity of 1300 cP or less. In detail, the sealing material may have a viscosity of 1200 cP to 1300 cP, In addition, the sealing material may include a material that is curable by light and has low reactivity with the light conversion material. For example, the sealing material may include the same material as the material forming the dam portion. For example, the sealing material may include polyurethane acrylate.

Hereinafter, various embodiments of the light path control member according to the embodiment will be described with reference to FIGS. 13 to 15.

Figure 13:
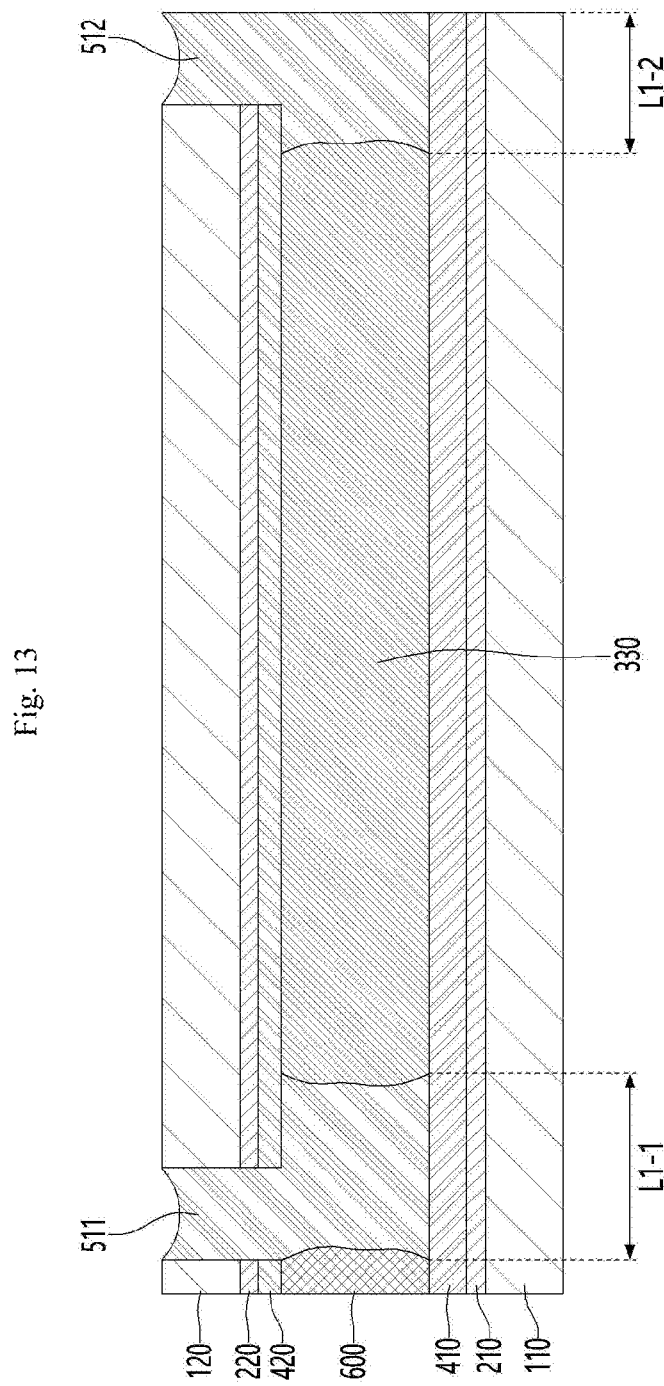
FIGS. 13 to 15 are cross-sectional views of light path control members according to other embodiments.

Referring to FIG. 13, lengths of the 1-1 sealing portion 511 and the 1-2 sealing portion 512 in the direction of the receiving portion may be different.

In detail, the length L-1 of the 1-1 sealing portion 511 may be greater than the length L-2 of the 1-2 sealing portion 512, or the length L-2 of the 1-2 sealing portion 512 may be greater than the length L-1 of the 1-1 sealing portion 511.

Accordingly, when the light path control member is applied to a display device, sealing reliability may be improved while maintaining the size of the light path control member.

That is, when the light path control member is applied to a display device such as a laptop computer or a monitor, the light path control member may be used standing at an angle of 45° to 90°. Accordingly, since any one of the 1-1 sealing portion 511 and the 1-2 sealing portion 512 is disposed below, the light conversion material may more easily flow out than the other sealing portion due to gravity.

Accordingly, among the length L-1 of the 1-1 sealing portion 511 in the direction of the receiving portion and the length L-1 of the 1-2 sealing portion 512 in the direction of the receiving portion, the length of the sealing portion disposed at the lower part during use is longer than the other sealing portion, and thus leakage of the light conversion material to the outside may be effectively inhibited. In addition, since the length of the sealing portion disposed on the upper part is formed short to maintain the entire length of the sealing portion, the size of the light path control member may be maintained. In addition, through this, the size of the entire bezel area may be reduced.

Figure 14:
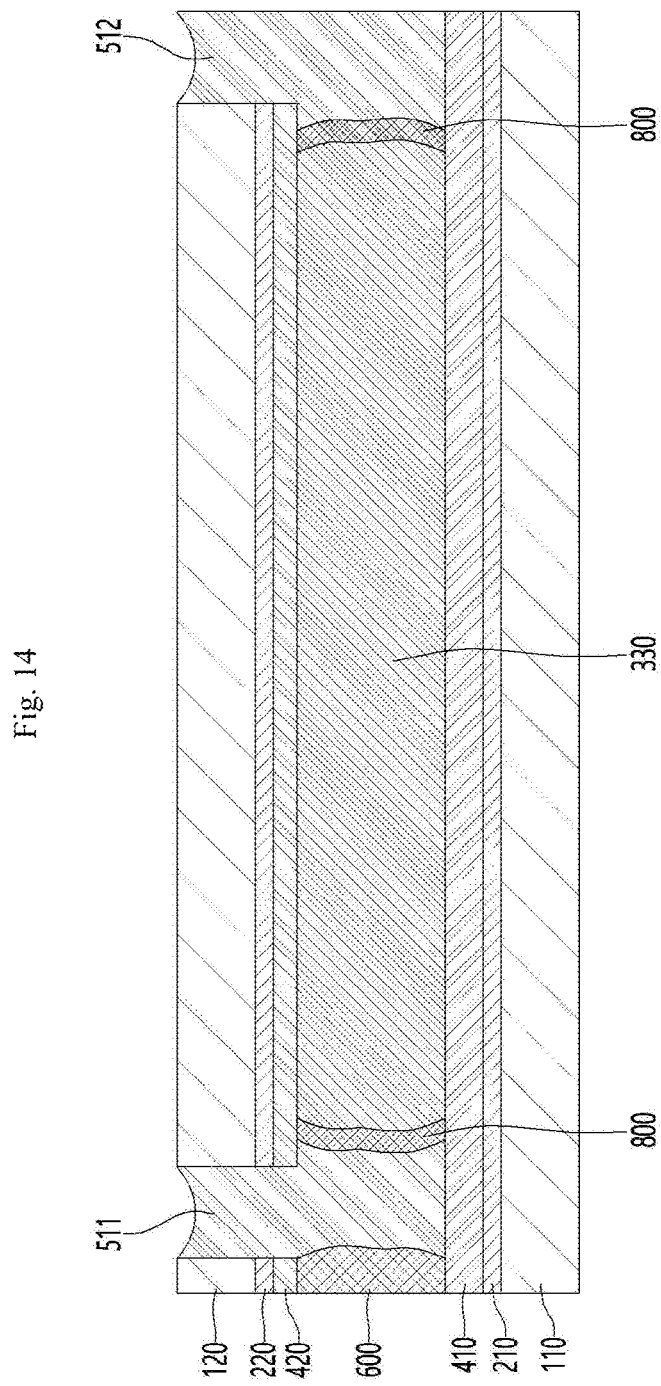

Referring to FIG. 14, a mixed region 800 may be disposed between the light conversion material 330 and the first sealing portion 510 inside the receiving portion 320.

The mixed region 800 may be a region in which the sealing material and the light conversion material are mixed. When the amount of the sealing material in the mixed region 800 is greater than the amount of the light conversion material, the mixed region 800 may be cured and serve as a sealing portion. Alternatively, when the amount of the light conversion material in the mixed region 800 is greater than the amount of the sealing material, the mixed region 800 may serve as a light converting part.

Figure 15:
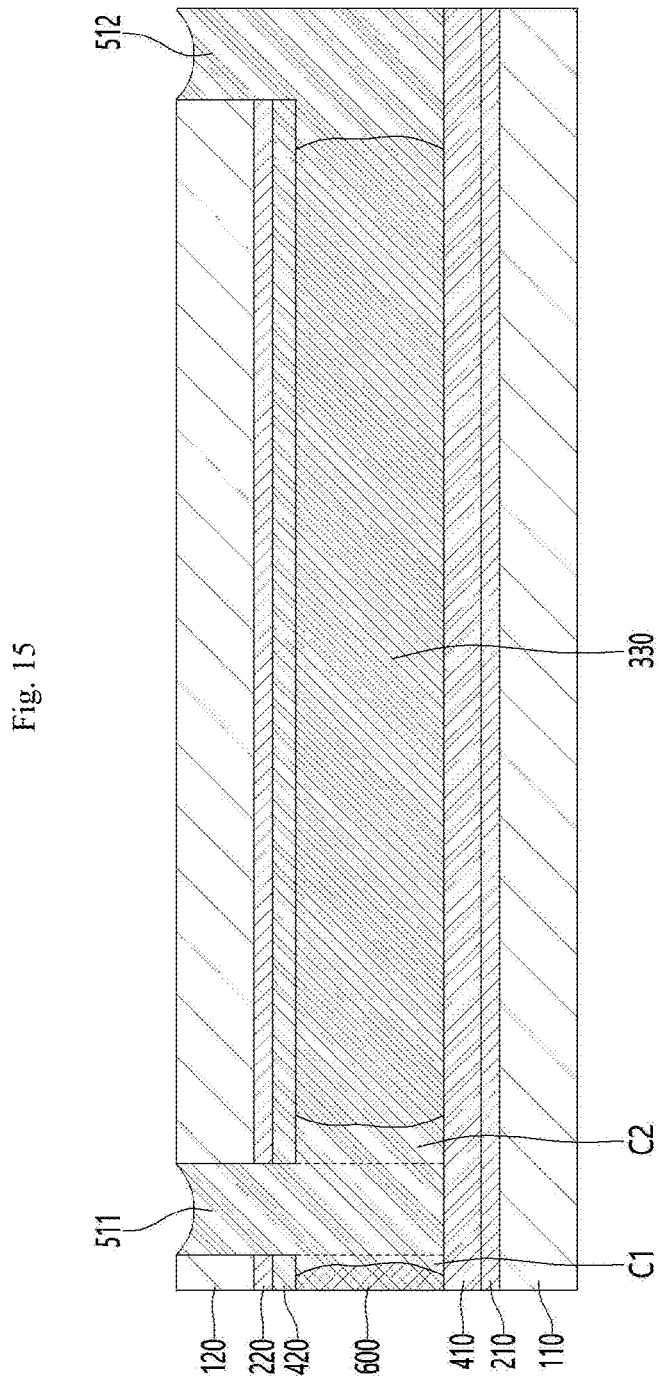

Referring to FIG. 15, the first sealing portion 510 may be formed by bending in a plurality of directions.

In detail, the first sealing portion 510 may be disposed to extend in one longitudinal direction and the other longitudinal direction of the receiving portion 320 based on the sealing region SA. In detail, the first sealing portion 510 may include a first bending C1 area extending in the direction of the light conversion material 330 and a second bending area C2 extending in the direction of the dam portion 600.

Lengths of the first bending area C1 and the second bending area C2 in the direction of the receiving portion 320 may be equal to each other. Alternatively, lengths of the first bending area C1 and the second bending area C1 in the direction of the receiving portion 320 may be different from each other.

Since the second bending area C2 is formed, it is possible to inhibit a void from being formed between the dam portion 600 and the first sealing portion 510. Accordingly, it is possible to inhibit the void from being visually recognized from the outside, and it is possible to inhibit luminance non-uniformity due to a difference in transmittance of the receiving portion due to the void.

FIGS. 16 to 21 are cross-sectional views taken along line D-D' of FIG. 1. That is, FIGS. 16 to 21 are cross-sectional views taken along one end and the other end of an electrode region formed on the second substrate 120.

Figure 16:
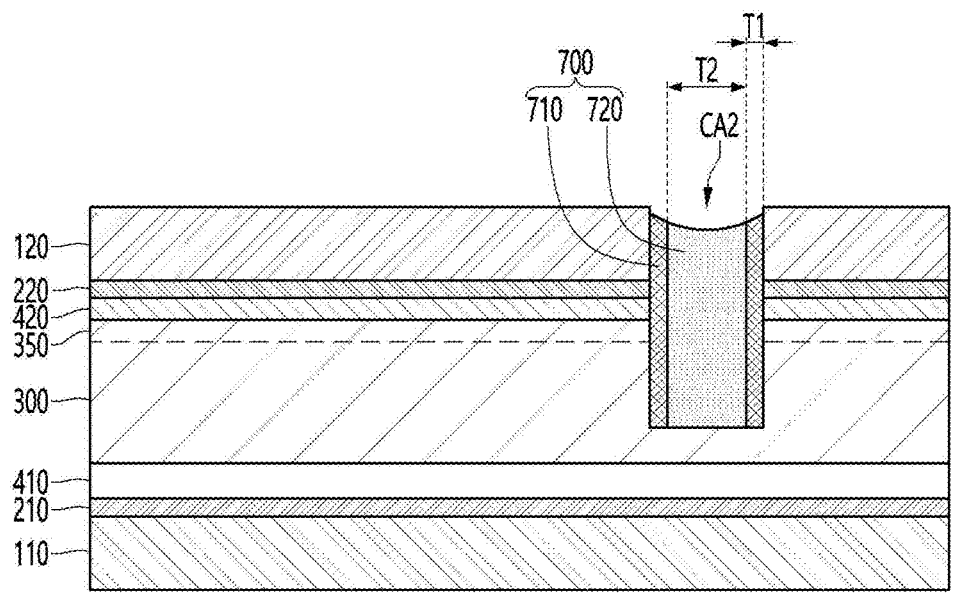
FIGS. 16 to 21 are cross-sectional views taken along the area D-D' of FIG. 1.
Figure 17:
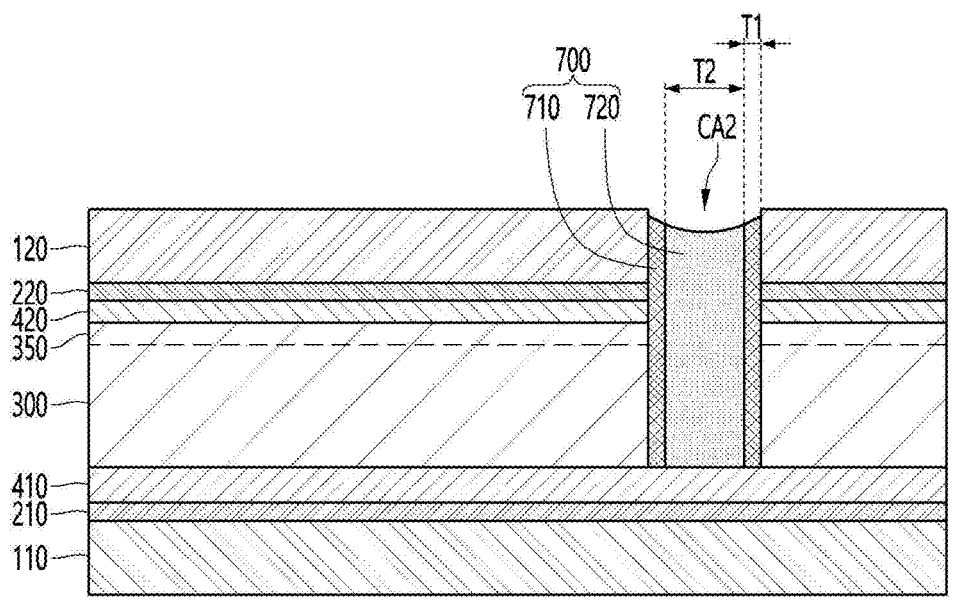

Referring to FIGS. 1, 16 and 17, an electrode region EA may be formed on the second substrate 120. The electrode region EA may be formed penetrating one area of the second substrate 120. That is, the electrode region EA may be a hole area formed in the second substrate 120.

In detail, the electrode region EA may be formed through the second substrate 120, the second electrode 210, the buffer layer 420, and the light conversion part 300. For example, referring to FIG. 16, the electrode region EA may be formed by penetrating the second substrate 120, the second electrode 220, and the buffer layer 420, and entirely or partially removing the light conversion part 300. Alternatively, referring to FIG. 17, the electrode region EA may be formed penetrating the second substrate 120, the second electrode 220, the buffer layer 420, and the light conversion part 300.

A length of the electrode region EA may be smaller than a length of the receiving portion 320 and a width of the electrode region EA may be greater than a width of the receiving portion 320.

The electrode region EA may be spaced apart from both ends of the second substrate 120 in the first direction 1A and both ends of the second substrate 120 in the second direction 2A. That is, the electrode region EA may be disposed inside the second substrate 120.

A conductive material may be disposed inside the electrode region EA. That is, an electrode connection portion 700 including a conductive material connected to the second electrode 220 may be disposed inside the electrode region EA.

That is, the electrode connection portion 700 including a conductive material may be disposed inside the electrode region EA, and the electrode connection portion 700 may serve as a second connection region CA2 of the second substrate 120.

The electrode connection portion 700 may include a plurality of layers. In detail, the electrode connection portion 700 may include a first electrode layer 710 and a second electrode layer 720. In detail, the electrode connection portion 700 may include the first electrode layer 710 disposed inside the electrode region EA and the second electrode layer 720 disposed on the first electrode layer 710.

In detail, the first electrode layer 710 may be disposed inside the electrode region EA and may be disposed in contact with the second substrate 120, the second electrode 220, the buffer layer 420, and the light conversion part 300.

For example, the first electrode layer 710 may be disposed in contact with a side surface of the second substrate 120, a side surface of the second electrode 220, a side surface of the buffer layer 420, and a side surface of the light conversion part 300.

Here, the side surface of the light conversion part 300 may be a side surface of a partition wall portion 310 constituting the light conversion part 300, a side surface of the receiving portion 320 constituting the light conversion part 300, or side surfaces of the partition wall portion 310 and the receiving portion 320.

The second electrode layer 720 may be disposed inside the electrode region EA and may be disposed in contact with the first electrode layer 710.

For example, as shown in FIG. 16, when the electrode region EA is formed to partially penetrate the light conversion part 300, the side surface of the second electrode layer 720 is disposed to contact the first electrode layer 710, and the bottom surface of the second electrode layer 720 is disposed to contact the light conversion part 300.

Alternatively, as shown in FIG. 17, when the electrode region EA is formed to entirely penetrate the light conversion part 300, the side surface of the second electrode layer 720 is disposed to contact the first electrode layer 710, and the bottom surface of the second electrode layer 720 is disposed to contact a top surface of the adhesive layer 410.

The first electrode layer 710 and the second electrode layer 720 may have different physical properties and thicknesses.

In detail, the first electrode layer 710 and the second electrode layer 720 may have different flexible characteristics. The first electrode layer 710 may be more flexible than the second electrode layer 720. That is, the first electrode layer 710 may not occur plastic deformation even with a greater stress than the second electrode layer 720. That is, when the light path control member is bent, plastic deformation may occur in the first electrode layer 710 at a greater curvature than the second electrode layer 720.

Also, the first electrode layer 710 and the second electrode layer 720 may have different light transmittances. In detail, the light transmittance of the first electrode layer 710 may be greater than the light transmittance of the second electrode layer 720.

Also, the first electrode layer 710 and the second electrode layer 720 may have different conductivity. In detail, the conductivity of the second electrode layer 720 may be greater than that of the first electrode layer 710.

Also, the first electrode layer 710 and the second electrode layer 710 may have different thicknesses. For example, a thickness T1 of the first electrode layer 710 may be smaller than a thickness T2 of the second electrode layer 720. In detail, the maximum thickness of the first electrode layer 710 may be smaller than the maximum thickness of the second electrode layer 720.

For example, the first electrode layer 710 may be formed with a thickness of a nanometer unit. In detail, the thickness T1 of the first electrode layer 710 may be 5 nm to 30 nm. Making the thickness of the first electrode layer 710 less than 5 nm may be difficult to implement in terms of a process, and when the thickness of the first electrode layer 710 exceeds 30 nm, the flexible characteristics of the electrode connection portion may decrease due to the thickness of the first electrode layer 710.

In addition, the first electrode layer 710 and the second electrode layer 720 may be disposed in different volumes. In detail, the volume of the second electrode layer 720 may be greater than that of the first electrode layer 710.

In addition, the first electrode layer 710 and the second electrode layer 720 may have different adhesive properties.

In detail, the first electrode layer 710 may have better adhesion to at least one of the second substrate 120 and the second electrode 220 than the second electrode layer 720.

Accordingly, overall adhesion of the electrode connection portion 700 may be improved by the first electrode layer 710.

The first electrode layer 710 and the second electrode layer 720 may include a conductive material. In detail, the first electrode layer 710 and the second electrode layer 720 may include different conductive materials.

For example, the first electrode layer 710 may include a transparent conductive material such as indium tin oxide, a conductive polymer, and a metal material such as copper, but the embodiment is not limited thereto.

Also, the second electrode layer 720 may include a conductive paste. For example, the second electrode layer 720 may include a metal paste. For example, the second electrode layer 720 may include silver paste.

The electrode connection portion 700 may have improved adhesion by the first electrode layer 710 and the second electrode layer 720.

The electrode region EA is formed through the second substrate 120, the second electrode 220, the buffer layer 420, and the light conversion part 300. In this case, since the second substrate 120, the second electrode 220, the buffer layer 420, and the light conversion part 300 include different materials, the inner surface of the electrode region EA may have a step or uneven surface for each layer instead of being flat.

At this time, when only the second electrode layer 720 is formed inside the electrode region EA, the electrode connection portion 700 and the inner surface of the electrode region EA are not completely adhered to each other, and a partially lifted region is formed, and thereby the adhesion of the electrode connection portion 700 may be reduced by reducing the contact area.

Accordingly, the contact area of the second electrode layer may be increased by first forming the first electrode layer inside the electrode region to remove a step or the like generated during formation of the electrode region, and then disposing the second electrode layer. Accordingly, the contact area of the electrode connection portion is increased inside the electrode region, so that it may have improved adhesion.

Also, the electrode connection portion 700 may have improved reliability by the first electrode layer 710 and the second electrode layer 720.

The second electrode layer may include a conductive paste, and brittleness of the conductive paste may increase after curing. Accordingly, when the light path control member is applied to a display device that is bent, plastic deformation easily occurs even at a small curvature due to stress generated as it is bent, and cracks occur at the contact surface of the electrode region, causing the electrode connection portion and the second electrode disconnection may occur.

Accordingly, by first forming a first electrode layer having a thin film thickness or having a more flexible characteristic than the second electrode layer, and then forming the second electrode layer, when applying the light path control member to a flexible display device, By minimizing plastic deformation in the first electrode layer, it is possible to minimize cracks occurring in the electrode connection portion and consequent disconnection.

In addition, the electrode connection portion 700 may have improved light transmittance by the first electrode layer 710 and the second electrode layer 720.

The second electrode layer may include a conductive paste, and the conductive paste has very low light transmittance, so that the light transmittance of the light path control member may be reduced as a whole by reducing the transmittance of light passing through the electrode connection portion.

Accordingly, by forming the first electrode layer having a relatively higher light transmittance than the second electrode layer on the surface of the electrode connection part, relatively high light transmittance can be implemented compared to the electrode connection part composed of only the second electrode layer.

Also, the electrode connection portion 700 may have improved conductivity by the first electrode layer 710 and the second electrode layer 720.

That is, as the second electrode layer having high conductivity is disposed to have a larger thickness and volume than the first electrode layer having low conductivity, it is possible to inhibit a decrease in conductivity of the electrode connection part and simultaneously improve flexible characteristics.

Figure 18:
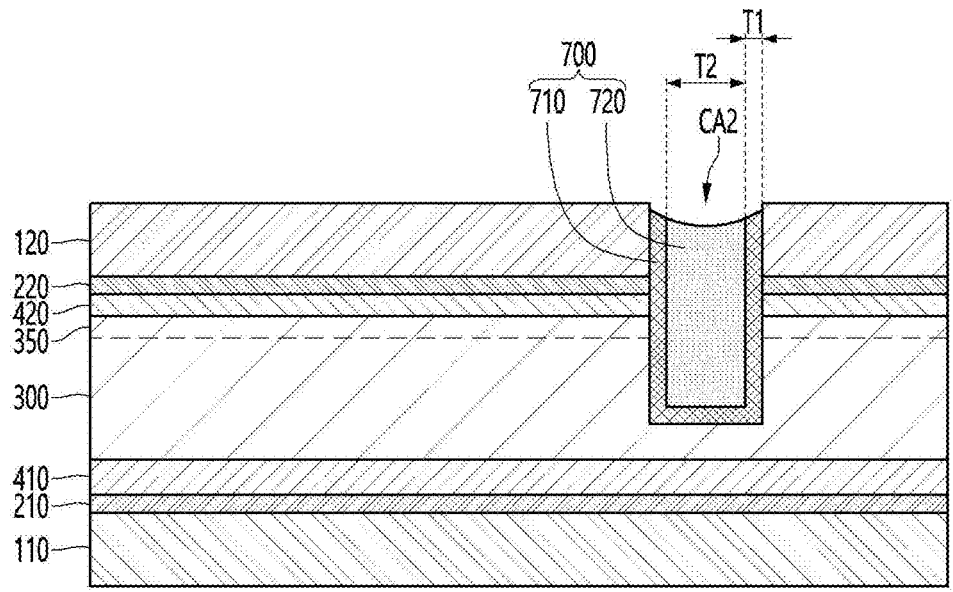
Figure 19:
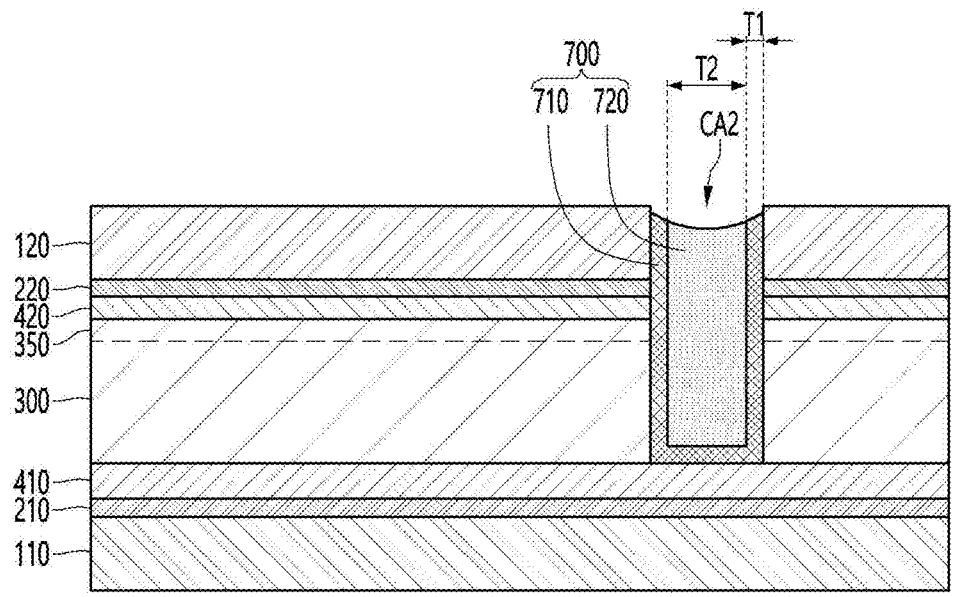

Meanwhile, referring to FIGS. 18 and 19, the electrode connection portion 700 may be all disposed on inner surfaces of the electrode region EA.

In detail, referring to FIG. 18, the electrode connection portion 700 may contact a side surface of the second substrate 120 formed by the electrode region EA, a side surface of the second electrode 220 formed by the electrode region EA, a side surface of the buffer layer 420 formed by the electrode region EA, and a side surface of the light conversion part 300 formed by the electrode region EA, and the electrode connection portion 700 may contact an upper surface of the light conversion part 300 exposed by the electrode region EA, that is, at least one of an upper surface of the partition wall portion 310 and an upper surface of the receiving portion 320.

Alternatively, referring to FIG. 19, the electrode connection portion 700 may contact a side surface of the second substrate 120 formed by the electrode region EA, a side surface of the second electrode 220 formed by the electrode region EA, a side surface of the buffer layer 420 formed by the electrode region EA, and a side surface of the light conversion part 300 formed by the electrode region EA, and the electrode connection portion 700 may contact an upper surface of the light adhesive layer 410 exposed by the electrode region EA Since the electrode connection portion 700 are disposed on all of the inner surfaces of the electrode region EA exposed by the electrode region EA, adhesion of the electrode connection portion 700 is improved, a difference in adhesion between the lower surface and the inner surface of the electrode region is removed, thereby inhibiting a specific region of the electrode connection portion from being delaminated when the light path control member is applied to a bent display device.

Figure 20:
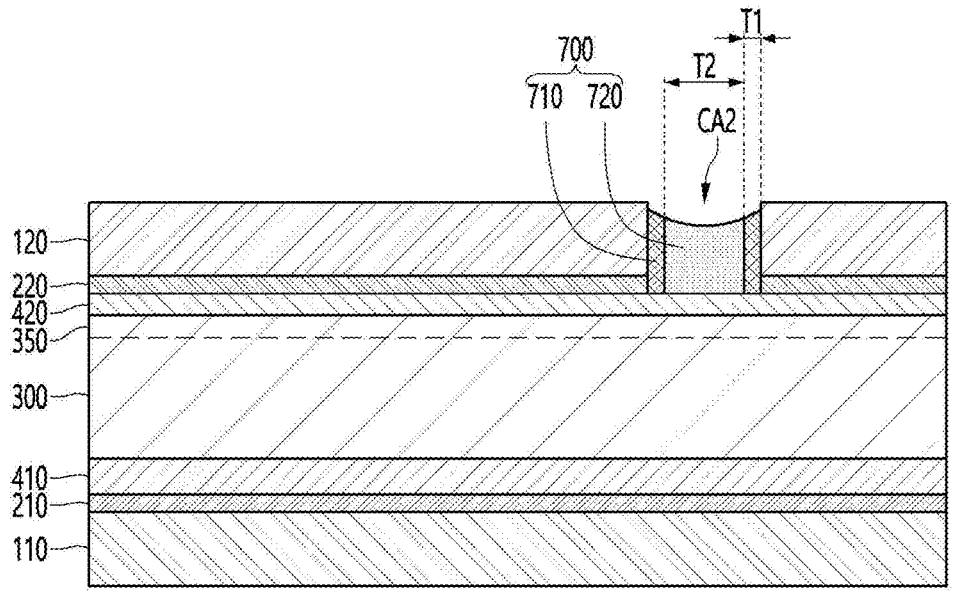
Figure 21:
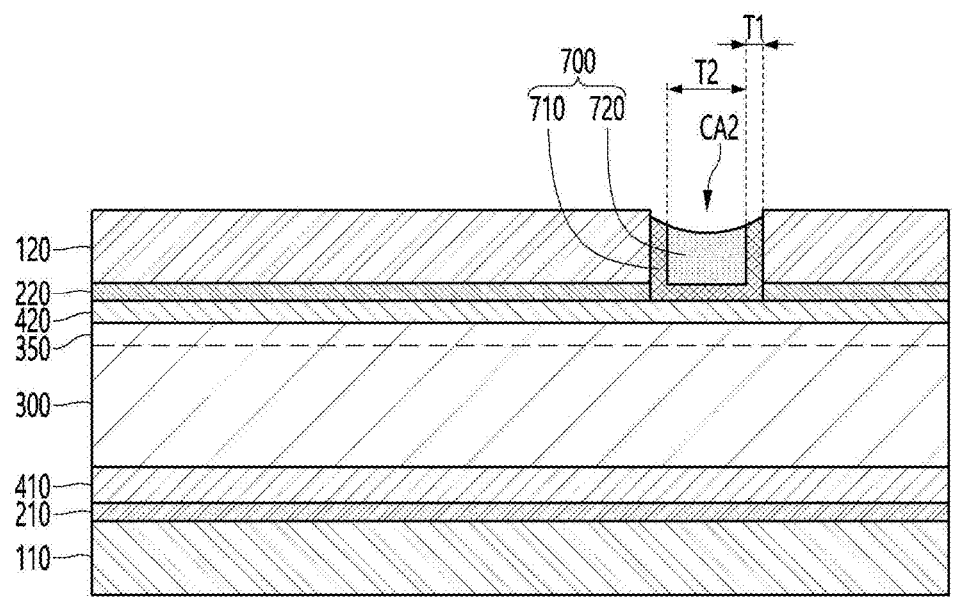

Meanwhile, referring to FIGS. 20 and 21, the electrode region EA may be formed through only the second substrate 120 and the second electrode 220.

Accordingly, a side surface of the second substrate 120, a side surface of the second electrode 220, and an upper surface of the buffer layer 420 may be exposed by the electrode region EA.

Referring to FIG. 20, the electrode connection portion 700 may be disposed in contact with a side surface of the second substrate 120 formed by the electrode region EA and a side surface of the second electrode 220 formed by the electrode region EA.

Alternatively, referring to FIG. 21, the electrode connection portion 700 may be disposed in contact with a side surface of the second substrate 120 formed by the electrode region EA, a side surface of the second electrode 220 formed by the electrode region EA, and an upper surface of the buffer layer 420 formed by the electrode region EA.

By reducing the depth of the electrode region EA where the electrode connection portion 700 is disposed, the area where the second electrode 220 layer having low light transmittance is disposed may be reduced. That is, since the electrode region EA is formed only to a depth at which the side surface of the second electrode 220 connected to the electrode connection portion 700 is exposed, the thickness of the second electrode layer of the electrode connection portion may be reduced.

Accordingly, the light path control member may minimize a decrease in light transmittance caused by the second electrode layer.

Hereinafter, with reference to FIGS. 1, 22, and 23, the light path control member including the above-described first sealing portion will be described in detail.

Figure 22:
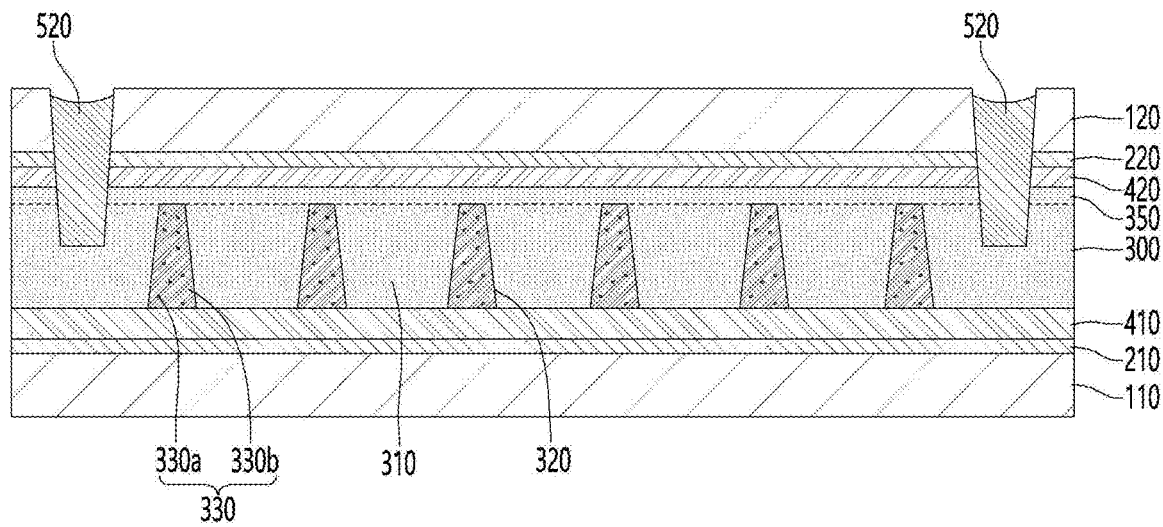
FIGS. 22 and 23 are cross-sectional views taken along the area E-E' of FIG. 1
Figure 23:
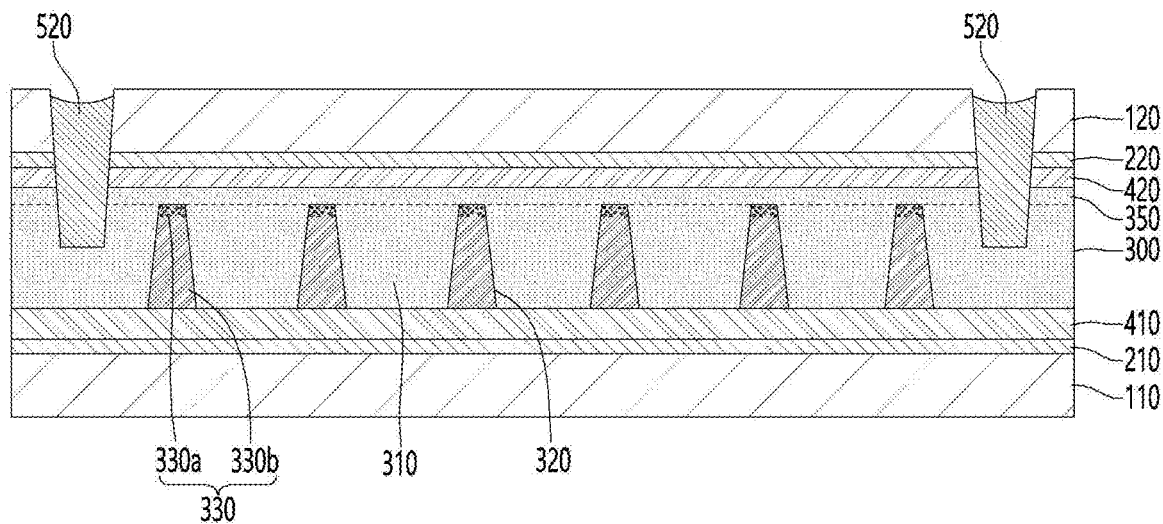

Referring to FIGS. 1, 22 and 23, the light path control member 1000 according to the embodiment may include the first substrate 110, the second substrate 120, the first electrode 210, the second electrode 220, and the light conversion part 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the light path control member including the first substrate 110 may also be formed to have flexible, curved, or bent characteristics. Accordingly, the light path control member according to the embodiment may be changed to various designs.

The first substrate 110 may extend in a first direction 1A, a second direction 2A, and a third direction 3A.

In detail, the first substrate 110 may include the first direction 1A corresponding to the length or width direction of the first substrate 110, the second direction 2A extending in a direction different from the first direction and corresponding to the length or width direction of the first substrate 110, and the third direction 3A extending in a direction different from the first and second directions and corresponding to the thickness direction of the first substrate 110.

For example, the first direction 1A may be defined as the length direction of the first substrate 110, the second direction 2A may be defined as the width direction of the first substrate 110 perpendicular to the first direction 1A, and the third direction 3A may be defined as the thickness direction of the first substrate 110. Alternatively, the first direction 1A may be defined as the width direction of the first substrate 110, the second direction 2A may be defined as the length direction of the first substrate 110 perpendicular to the first direction 1A, and the third direction 3A may be defined as the thickness direction of the first substrate 110.

Hereinafter, for convenience of description, the first direction 1A is described as the length direction of the first substrate 110, the second direction 2A is described as the width direction of the first substrate 110, and the third direction 3A is described as the thickness direction of the first substrate 110.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo), gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the light path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the second substrate 120 may be a flexible substrate having flexible characteristics.

Further, the second substrate 120 may be a curved or bended substrate. That is, the light path control member including the second substrate 120 may also be formed to have flexible, curved, or bent characteristics. Accordingly, the light path control member according to the embodiment may be changed to various designs.

The second substrate 120 may also extend in the first direction 1A, the second direction 2A, and the third direction 3A like the first substrate 110 described above.

In detail, the second substrate 120 may include the first direction 1A corresponding to the length or width direction of the second substrate 120, the second direction 2A extending in a direction different from the first direction and corresponding to the length or width direction of the second substrate 120, and the third direction 3A extending in a direction different from the first and second directions and corresponding to the thickness direction of the second substrate 120.

For example, the first direction 1A may be defined as the length direction of the second substrate 120, the second direction 2A may be defined as the width direction of the second substrate 120 perpendicular to the first direction 1A, and the third direction 3A may be defined as the thickness direction of the second substrate 120.

Alternatively, the first direction 1A may be defined as the width direction of the second substrate 120, the second direction 2A may be defined as the length direction of the second substrate 120 perpendicular to the first direction 1A, and the third direction 3A may be defined as the thickness direction of the second substrate 120.

Hereinafter, for convenience of description, the first direction 1A is described as the length direction of the second substrate 120, the second direction 2A is described as the width direction of the second substrate 120, and the third direction 3A is described as the thickness direction of the second substrate 120.

The second electrode 220 may be disposed on one surface of the second substrate 112. In detail, the second electrode 220 may be disposed on a lower surface of the second substrate 120. That is, the second electrode 220 may be disposed on a surface of the second substrate 120 on which the second substrate 120 and the first substrate 110 face each other. That is, the second electrode 220 may be disposed facing the first electrode 210 on the first substrate 110. That is, the second electrode 220 may be disposed between the first electrode 210 and the second substrate 120.

The second electrode 220 may include a material identical to or similar to that of the first electrode 210 described above.

The second electrode 220 may include a transparent conductive material. For example, the second electrode 220 may include a conductive material having a light transmittance of about 80% or more. For example, the second electrode 220 may include a metal oxide such as indium tin oxide, indium zinc oxide, copper oxide, tin oxide, zinc oxide, titanium oxide, etc.

The second electrode 220 may have a thickness of 10 nm to 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo), gold (Au), titanium (Ti), and alloys thereof.

The second electrode 220 may be disposed on the entire surface of one surface of the second substrate 120. However, the embodiment is not limited thereto, and the second electrode 220 may be formed of a plurality of pattern electrodes having a uniform pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even though the second electrode 220 includes a metal, the second electrode 220 is not visually recognized from the outside, so that visibility may be improved. In addition, the light transmittance is increased by the openings, so that the brightness of the light path control member according to the embodiment may be improved.

The first substrate 110 and the second substrate 120 may include a protrusion. Referring to FIG. 1, the first substrate 110 may include a first protrusion, and the second substrate 120 may include a second protrusion. In detail, the first substrate 110 and the second substrate 120 may include the first protrusion and the second protrusion that are disposed to be misaligned from each other, respectively.

A connection region connected to an external printed circuit board or a flexible printed circuit board may be formed in the first protrusion of the first substrate 110 and the second protrusion of the second substrate 120, respectively.

In detail, a first connection region CA1 may be disposed on the first protrusion, and a second connection region CA2 may be disposed on the second protrusion. When the first protrusion and the second protrusion are disposed at positions misaligned from each other, the first connection region CA1 and the second connection region CA2 may be disposed so as not to overlap in the third direction 3A.

The first connection region CA1 and the second connection region CA2 may be disposed on the same plane. Alternatively, the first connection region CA1 and the second connection region CA2 may be disposed on different surfaces.

When the first connection region CA1 and the second connection region CA2 are disposed on the same plane, when connecting the first connection region CA1 and the second connection region CA2 to the printed circuit board or to the flexible printed circuit board, they may be connected on the same plane, and thus they may be easily connected.

A conductive material may be exposed on upper surfaces of the first connection region CA1 and the second connection region CA2, respectively. For example, the first electrode 210 may be exposed in the first connection area CA1, and an electrode connection portion 700 filled in a hole formed in the second substrate 120 may be exposed in the second connection area CA2. The light path control member may be electrically connected to an external printed circuit board or a flexible printed circuit board by the first connection region CA1 and the second connection region CA2.

For example, a pad portion may be disposed on the first connection region CA1 and the second connection region CA2, and a conductive adhesive including at least one of an anisotropic conductive film (ACF) and anisotropic conductive pastes (ACP) may be disposed between the pad portion and the printed circuit board or the flexible printed circuit board to connect the light path control member.

Alternatively, the conductive adhesive including at least one of an anisotropic conductive film (ACF) and anisotropic conductive pastes (ACP) may be disposed between the first connection region CA1 and the second connection region CA2 and the printed circuit board or the flexible printed circuit board to direct connect the light path control member without the pad portion.

The light path control member may include a plurality of sealing portions.

Referring to FIGS. 1, 22 and 23, the light path control member may include a first sealing portion 510 extending in a first direction of the light path control member and a second sealing portion 520 extending in a second direction of the light path control member.

The first sealing portion 510 may extend in a direction different from a longitudinal direction of the receiving portion 320. In addition, the second sealing portion 520 may extend in the same or similar direction as the longitudinal direction of the receiving portion 320.

The first sealing portion 510 may be disposed at both end regions of the light path control member in the second direction. In detail, the first sealing portion 510 may be disposed at one end and the other end of the light path control member in the second direction, respectively.

Also, the second sealing portion 520 may be disposed at both end regions of the light path control member in the first direction. In detail, the second sealing portion 520 may be disposed at one end and the other end of the light path control member in the first direction.

The first sealing portion 510 may be formed through the process described above. Also, the second sealing portion 520 may be formed by disposing a sealing material inside a sealing region formed by removing the second substrate 120, the second electrode 220, the buffer layer 420, the base portion 350, and part or all of the partition wall portion 310.

The light conversion part 300 may be disposed between the first substrate 110 and the second substrate 120. In detail, the light conversion part 300 may be disposed between the first electrode 210 and the second electrode 220.

The adhesive layer or the buffer layer may be disposed between at least one of between the light conversion part 300 and the first substrate 110 or between the light conversion part 300 and the second substrate 120, and the first substrate 110, the second substrate 120, and the light conversion part 300 may be adhered to each other by the adhesive layer and/or the buffer layer.

For example, the adhesive layer 410 may be disposed between the first electrode 210 and the light conversion part 300, thereby adhering the first substrate 110 and the light conversion unit 300.

In addition, the buffer layer 420 may be disposed between the second electrode 220 and the light conversion part 300, thereby improving adhesion between the second electrode 220 including different materials and the light conversion unit 300.

The light conversion part 300 may include a plurality of partition wall portions 310 and receiving portions 320. The light conversion material 330 including light conversion particles that move when a voltage is applied and a dispersion liquid for dispersing the light conversion particles may be disposed in the receiving portion, and light transmission characteristics of the light path control member may be changed by the light conversion particles.

In addition, the above-described first sealing portion 510 and a dam portion 600 for easily injecting the light conversion material 330 may be disposed in the receiving portions 320.

The receiving portion 320 may be disposed extending in one direction. In detail, the receiving portion 320 may extend in a direction corresponding to the second direction 2A of the first substrate 110 or the second substrate 120. That is, the receiving portion 320 may extend in a direction corresponding to a width direction of the first substrate 110 or the second substrate 120 and may be disposed.

Accordingly, both ends of the receiving portion 320 of the light path control member according to the embodiment may be disposed facing both ends of the first substrate 110 or the second substrate 120, respectively. That is, one end of the receiving portion 320 faces one end of the first substrate 110 or the second substrate 120 in the second direction 2A, and another end of the receiving portion 320 faces another end of the first substrate 110 or the second substrate 120 in the second direction 2A.

Accordingly, both ends of the receiving portion 320 may be disposed in contact with the first sealing portion 510 disposed facing each other in the second direction 2A, and may be disposed apart from the second sealing portion 520.

Meanwhile, the receiving portion 320 may extend to the second protrusion, and the receiving portion 320 on the second protrusion may not comprise the light conversion material or may comprise less light conversion material than another receiving portion.

Meanwhile, the receiving portion 320 may be tilted at a predetermined angle with respect to the second direction of the first substrate 110 or the second substrate 120.

That is, the receiving portion 320 may be inclined at a predetermined angle with respect to the second direction of the light path control member.

Accordingly, when the light path control member and the display panel are combined to form a display device, it is possible to inhibit a moiré phenomenon from occurring due to overlapping of a pattern of the receiving portion of the light path control member and a pixel pattern of the display panel.

Accordingly, when a user views the display device from the outside, it is possible to inhibit a pattern from being visually recognized due to a moiré phenomenon caused by overlapping the pattern of the receiving portion of the light path control member and the pixel pattern of the display panel.

Referring to FIGS. 22 and 23, the light conversion part 300 may the partition wall portion 310 and the receiving portion 320.

The partition wall portion 310 may be defined as a partition wall dividing the receiving portion. That is, the partition wall portion 310 may transmit light as a partition wall region dividing a plurality of receiving portions. That is, light emitted in the direction of the first substrate 110 or the second substrate 120 may pass through the partition wall portion.

The receiving portion 320 may be formed to partially penetrate the light conversion part 300. Accordingly, the receiving portion 320 may be disposed while contacting the adhesive layer 410 and spaced apart from the buffer layer 420. Accordingly, the base portion 350 may be formed between the receiving portion 320 and the buffer layer 420.

The base portion 350 may be disposed on the partition wall portion 310. In detail, the base portion 350 may be disposed below the second electrode 220, and the partition wall portion 310 may be disposed below the base portion 350.

The partition wall portion 310 and the base portion 350 may include a resin material. For example, the partition wall portion 310 and the base portion 350 may include a photo-curable resin material. For example, the partition wall portion 310 and the base portion 350 may include a UV resin or a transparent photoresist resin. Alternatively, the partition wall portion 310 and the base portion 350 may include urethane resin or acrylic resin.

The partition wall portion 310 and the receiving portion 320 may be disposed to extend in the second direction 2A of the first substrate 110 and the second substrate 120. That is, the partition wall portion 310 and the receiving portion 320 may be disposed to extend in the width direction or the length direction of the first substrate 110 and the second substrate 120.

The partition wall portion 310 and the receiving portion 320 may be disposed to have different widths. For example, a width of the partition wall portion 310 may be greater than that of the receiving portion 320.

In addition, the receiving portion 320 may be formed in a shape extending from the first electrode 210 toward the second electrode 220 and narrowing in width.

The partition wall portion 310 and the receiving portion 320 may be alternately disposed with each other. In detail, the partition wall portion 310 and the receiving portion 320 may be alternately disposed with each other. That is, each of the partition wall portions 310 may be disposed between the receiving portions 320 adjacent to each other, and each of the receiving portions 320 may be disposed between the partition wall portions 310 adjacent to each other.

The light conversion material 330 including light conversion particles 330b and the dispersion liquid 330a in which the light conversion particles 330b are dispersed may be disposed in the receiving portion 320.

The dispersion liquid 330a may be a material for dispersing the light conversion particles 330b. The dispersion liquid 330a may include a transparent material. The dispersion liquid 330a may include a non-polar solvent. In addition, the dispersion liquid 330a may include a material capable of transmitting light.

The light conversion particles 330b may be disposed to be dispersed in the dispersion liquid 330a. In detail, the plurality of light conversion particles 330b may be disposed to be spaced apart from each other in the dispersion liquid 330a.

The light conversion particles 330b may include a material capable of absorbing light. That is, the light conversion particles 330b may be light absorbing particles. The light conversion particles 330b may have a color. For example, the light conversion particles 330b may have a black-based color. As an example, the light conversion particles 330b may include carbon black.

The light conversion particles 330b may have a polarity by charging a surface thereof. For example, the surface of the light conversion particles 330b may be charged with a negative (−) charge. Accordingly, according to the application of the voltage, the light conversion particles 330b may move toward the first electrode 210 or the second electrode 220.

The light transmittance of the receiving portion 320 may be changed by the light conversion particles 330b. In detail, the receiving portion 320 may be converted into the light blocking part and the light transmitting part by changing the light transmittance due to the movement of the light conversion particles 330b. That is, the receiving portion 320 may change the transmittance of light passing through the receiving portion 320 by dispersion and aggregation of the light conversion particles 330b disposed inside the dispersion liquid 330a.

For example, the light path control member according to the embodiment may be switched from a first mode to a second mode or from the second mode to the first mode by a voltage applied to the first electrode 210 and the second electrode 220.

In detail, in the light path control member according to the embodiment, the receiving portion 320 becomes the light blocking part in the first mode, and light of a specific angle may be blocked by the receiving portion 320. That is, a viewing angle of the user viewing from the outside is narrowed, so that the light path control member may be driven in a privacy mode.

In addition, in the light path control member according to the embodiment, the receiving portion 320 becomes the light transmitting part in the second mode, and in the light path control member according to the embodiment, light may be transmitted through both the partition wall portion 310 and the receiving portion 320. That is, the viewing angle of the user viewing from the outside may be widened, so that the light path control member may be driven in a public mode.

Switching from the first mode to the second mode, that is, the conversion of the receiving portion 320 from the light blocking part to the light transmitting part may be realized by movement of the light conversion particles 330*b* of the receiving portion 320. That is, the light conversion particles 330*b* may have a charge on the surface thereof and may move toward the first electrode or the second electrode according to the application of a voltage according to characteristics of the charge. That is, the light conversion particles 330*b* may be electrophoretic particles.

For example, when a voltage is not applied to the light path control member from the outside, the light conversion particles 330*b* of the receiving portion 320 are uniformly dispersed in the dispersion liquid 330*a*, and the receiving portion 320 may block light by the light conversion particles 330*b*. Accordingly, in the first mode, the receiving portion 320 may be driven as the light blocking part.

In addition, when a voltage is applied to the light path control member from the outside, the light conversion particles 330*b* may move. For example, the light conversion particles 330*b* may move toward one end or the other end of the receiving portion 320 by a voltage transmitted through the first electrode 210 and the second electrode 220. That is, the light conversion particles 330*b* may move toward the first electrode 210 or the second electrode 220.

For example, when a voltage is applied to the first electrode 210 and/or the second electrode 220, an electric field is formed between the first electrode 210 and the second electrode 220, and the light conversion particles 330*b* charged with the negative charge may move toward a positive electrode of the first electrode 210 and the second electrode 220 using the dispersion liquid 330*b* as a medium.

As an example, in the initial mode or when the voltage is not applied to the first electrode 210 and/or the second electrode 220, as shown in FIG. 22 the light conversion particles 330*b* may be uniformly dispersed in the dispersion liquid 330*a*, and the receiving portion 320 may be driven as the light blocking part.

In addition, when the voltage is applied to the first electrode 210 and/or the second electrode 220, as shown in FIG. 23, the light conversion particles 330*b* may move toward the second electrode 220 in the dispersion liquid 330*b*. That is, the light conversion particles 330*b* move in one direction, and the accommodation part 320 may be driven as the light transmitting part.

Accordingly, the light path control member according to the embodiment may be driven in two modes according to a user's surrounding environment. That is, when the user requires light transmission only at a specific viewing angle, the receiving portion is driven as the light blocking part, or in an environment in which the user requires high brightness, a voltage may be applied to drive the receiving portion as the light transmitting part.

Therefore, since the light path control member according to the embodiment may be implemented in two modes according to the user's requirement, the light path control member may be applied regardless of the user's environment.

The above-described second sealing portion 520 may be disposed on an outermost side of the light path control member. In detail, the second sealing portion 520 extending in the second direction 2A and facing each other may be disposed at an outermost side of the light path control member in the first direction 1A.

The second sealing portion 520 may be disposed inside a sealing region formed on the second substrate 120.

For example, a sealing area formed by removing the light conversion part 300 including the second substrate 120, the second electrode 220, the buffer layer, 420 the base portion 350 and the partition wall portion 310 is formed on the second substrate 120, and the second sealing portion 520 may be formed by disposing a sealing material inside the sealing region.

Accordingly, the second sealing portion 520 may be disposed in contact with the side surface of the second substrate 120. In addition, the second sealing portion 520 may be disposed in contact with a side surface of the second electrode 220. In addition, the second sealing portion 520 may be disposed in contact with a side surface of the buffer layer 420. In addition, the second sealing portion 520 may be disposed in contact with a side surface of the base portion 350. In addition, the second sealing portion 520 may be disposed in contact with a side surface of the partition wall portion 310.

The second sealing portion 520 is disposed on a side surface of the light path control member, that is, a side surface in the second direction, so that impurities that may permeate from the outside may be inhibited from penetrating into the inside of the light conversion part 300, that is, into the receiving portion 320 where the light conversion material 330 is disposed.

Hereinafter, referring to FIGS. 24 to 28, a display device to which the light path control member according to the embodiment is applied will be described.

Figure 24:
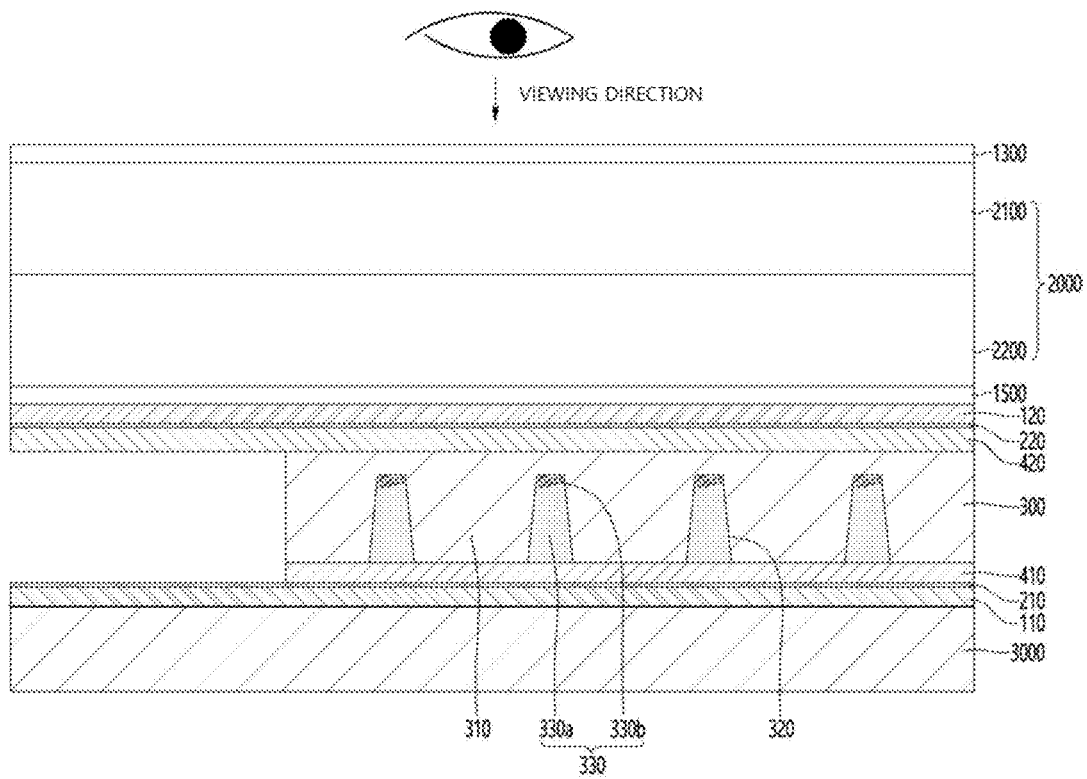
FIGS. 24 and 25 are cross-sectional views of a display device to which the light path control member according to the embodiment is applied.
Figure 25:
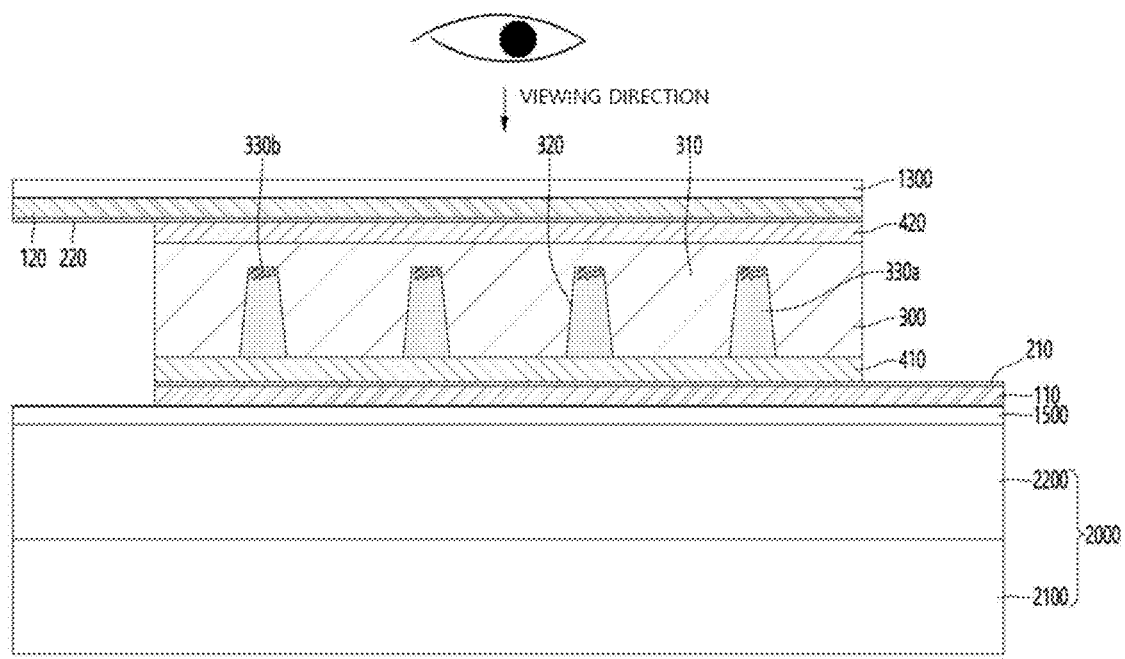

Referring to FIGS. 24 and 25, the light path control member 1000 according to an embodiment may be disposed on or under a display panel 2000.

The display panel 2000 and the light path control member 1000 may be disposed to be adhered to each other. For example, the display panel 2000 and the light path control member 1000 may be adhered to each other by an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the light path control member and the display panel, the light path control member and the display panel may be adhered after the release film is removed.

The display panel 2000 may include a first' substrate 2100 and a second' substrate 2200. When the display panel 2000 is a liquid crystal display panel, the light path control member may be formed under the liquid crystal panel. That is, when a surface viewed by the user in the liquid crystal panel is defined as an upper portion of the liquid crystal panel, the light path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 24, the light path control member may be disposed under the liquid crystal panel and on the backlight unit 3000, and the light path control member may be disposed between the backlight unit 3000 and the display panel 2000.

Alternatively, as shown in FIG. 25, when the display panel 2000 is an organic light emitting diode panel, the light path control member may be formed on the organic light emitting diode panel. That is, when the surface viewed by the user in the organic light emitting diode panel is defined as an upper portion of the organic light emitting diode panel, the light path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the light path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the light path control member 1000. Specifically, the functional layer 1300 may be adhered to one surface of the first substrate 110 of the light path control member. Although not shown in drawings, the functional layer 1300 may be adhered to the first substrate 110 of the light path control member via an adhesive layer. In addition, a release film for protecting the functional layer may be further disposed on the functional layer 1300.

Further, a touch panel may be further disposed between the display panel and the light path control member.

It is illustrated in the drawings that the light path control member is disposed at an upper portion of the display panel, but the embodiment is not limited thereto, and the light path control member may be disposed at various positions such as a position in which light is adjustable, that is, a lower portion of the display panel, or between a second substrate and a first substrate of the display panel, or the like.

In addition, it is shown in the drawings that the light conversion unit of the light path control member according to the embodiment is in a direction parallel or perpendicular to an outer surface of the second substrate, but the light conversion unit is formed to be inclined at a predetermined angle from the outer surface of the second substrate. Through this, a moire phenomenon occurring between the display panel and the light path control member may be reduced.

Figure 28:

Referring to FIGS. 26 to 28, the light path control member according to an embodiment may be applied to various display devices.

Referring to FIGS. 26 to 28, the light path control member according to the embodiment may be applied to a display device that displays a display.

For example, when power is applied to the light path control member as shown in FIG. 26, the accommodation part functions as the light transmitting part, so that the display device may be driven in the public mode, and when power is not applied to the light path control member as shown in FIG. 27, the accommodation part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 28, the display device to which the light path control member according to the embodiment is applied may also be applied inside a vehicle.

For example, the display device including the light path control member according to the embodiment may display a video confirming information of the vehicle and a movement route of the vehicle. The display device may be disposed between a driver seat and a passenger seat of the vehicle.

In addition, the light path control member according to the embodiment may be applied to a dashboard that displays a speed, an engine, an alarm signal, and the like of the vehicle.

Further, the light path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light path control member comprising:
a first substrate;
a first electrode disposed on the first substrate;
a second substrate disposed on the first substrate;
a second electrode disposed under the second substrate; and
a light conversion part disposed between the first electrode and the second electrode,
wherein the light conversion part includes a plurality of partition wall portions, at least one receiving portion, and a base portion,
wherein the light conversion part is adapted to change a viewing angle of light transmitted through the light path control member due to a movement of electrophoretic particles by application of a voltage between the first electrode and the second electrode, and
wherein the electrophoretic particles are disposed in the at least one receiving portion,
wherein each of the plurality of partition wall portions partitions the light conversion part such that the partition wall portions and the at least one receiving portion are alternately disposed, and wherein the base portion is a region formed during an imprinting process for forming the partition wall portions and the at least one receiving portion,
wherein a light conversion material is disposed in the at least one receiving portion,
wherein the light path control member comprises a first sealing portion sealing the light conversion material,
wherein the first sealing portion is arranged along a horizontal direction extending from one end to an other end,
wherein the other end of the first sealing portion extends into an inner region of the at least one receiving portion,
wherein a sealing region is formed by removing the second substrate and the second electrode, wherein the sealing region is a region where the second substrate and the second electrode are removed to allow injection of the light conversion material and a sealing material,
wherein the first sealing portion is disposed extending from the sealing region into the at least one receiving portion,
wherein the first sealing portion includes a bending area between one end and the other end,
wherein the first sealing portion includes a first part disposed in the sealing region; and a second part disposed inside the at least one receiving portion,
wherein a first length of the first part and a second length of the second part are defined as lengths in the extension direction of the receiving portion, the first length and the second length are defined for each of the at least one receiving portion,
wherein a maximum deviation length of the second part disposed in the receiving portion is 100 μm or less, and
wherein the first sealing portion includes a plurality of bending areas that contact each of the at least one receiving portions.

2. The light path control member of claim 1, wherein the first sealing portion includes a 1-1 sealing portion and a 1-2 sealing portion disposed facing each other.

3. The light path control member of claim 2, wherein the second length is 100 μm to 2 mm.

4. The light path control member of claim 2, wherein a length of the 1-1 sealing portion and a length of the 1-2 sealing portion are different from each other.

5. The light path control member of claim 1, wherein the first sealing portion includes the sealing material,
wherein the first sealing portion contacts the inner surface of the at least one receiving portion.

6. The light path control member of claim 5, wherein a viscosity of the sealing material is 1200 cP to 1300 cP.

7. The light path control member of claim 1, wherein the first length is 100 μm to 2 mm.

8. The light path control member of claim 7, wherein the second length is at least 50% of the first length.

9. The light path control member of claim 1, wherein the maximum deviation length of the second length disposed in the at least one receiving portion is 1 μm to 100 μm.

10. The light path control member of claim 1, wherein a pitch deviation of the partition wall portions is 40 μm or less.

11. The light path control member of claim 1, wherein the first length, the second length, and the maximum deviation length are different.

12. The light path control member of claim 11, wherein the first length is greater than the second length and the maximum deviation length,
wherein the second length is greater than the maximum deviation length.

13. The light path control member of claim 1, comprising a mixed region between the first sealing portion and the light conversion material.

14. The light path control member of claim 13, wherein the mixed region is defined as a region in which the sealing material and the light conversion material are mixed.

15. The light path control member of claim 1, wherein the first sealing portion is bent in a plurality of directions.

16. The light path control member of claim 1, wherein the first sealing portion includes a first bending area extending toward the light conversion material; and a second bending area extending in a direction of a dam portion.

17. The light path control member of claim 16, wherein a length of the first bending area and a length of the second bending area are different.

18. A display device comprising:
a panel including at least one of a display panel and a touch panel; and
the light path control member of claim 1, which is disposed on or under the panel.

* * * * *